(12) United States Patent
Degani et al.

(10) Patent No.: US 12,149,207 B2
(45) Date of Patent: Nov. 19, 2024

(54) HIGH VOLTAGE DIGITAL POWER AMPLIFIER

(71) Applicant: Intel Corporation, Santa Clara, CA (US)

(72) Inventors: Ofir Degani, Nes-Ammin (IL); Assaf Ben-Bassat, Haifa (IL); Ashoke Ravi, Portland, OR (US); Ina Shternberg, Haifa (IL); Naor Shay, Rehovot (IL)

(73) Assignee: Intel Corporation, Santa Clara, CA (US)

( * ) Notice: Subject to any disclaimer, the term of this patent is extended or adjusted under 35 U.S.C. 154(b) by 673 days.

(21) Appl. No.: 17/323,189

(22) Filed: May 18, 2021

(65) Prior Publication Data
US 2022/0376657 A1 Nov. 24, 2022

(51) Int. Cl.
*H03F 1/02* (2006.01)
*H03F 3/21* (2006.01)

(52) U.S. Cl.
CPC ............. *H03F 1/0205* (2013.01); *H03F 3/21* (2013.01)

(58) Field of Classification Search
CPC ........ H03F 1/0205; H03F 3/21; H03F 1/0211; H03F 2200/451; H03F 3/193; H03F 3/245; H03F 2203/30084; H03F 2203/30117; H03F 1/223; H03F 3/2178; H03F 3/3064; H03F 3/2171; H03K 17/102; H03K 17/063
USPC .............................. 330/277, 298, 311, 207 P
See application file for complete search history.

(56) References Cited

U.S. PATENT DOCUMENTS

| | | | |
|---|---|---|---|
| 6,693,469 B2 * | 2/2004 | Prodanov | H03K 19/00315 327/170 |
| 8,860,497 B1 * | 10/2014 | Pattnayak | H03K 17/0822 327/108 |
| 2011/0102070 A1 | 5/2011 | Chen et al. | |
| 2012/0200338 A1 | 8/2012 | Olson | |
| 2014/0240047 A1 | 8/2014 | Lai et al. | |
| 2016/0285454 A1 | 9/2016 | Gupta et al. | |
| 2019/0288653 A1 | 9/2019 | Yoo et al. | |

FOREIGN PATENT DOCUMENTS

WO 2005/076465 A1 8/2005

OTHER PUBLICATIONS

Sep. 9, 2022—(EP) Search Report—App. 22168518.3.

* cited by examiner

*Primary Examiner* — Hieu P Nguyen
(74) *Attorney, Agent, or Firm* — Banner & Witcoff Ltd.

(57) ABSTRACT

Techniques are disclosed to allow for a switched capacitor digital power amplifier (PA) that operates using high supply voltage levels beyond twice the maximum voltage rating for any of the transistor terminals such as Vds/Vdg/Vsg.

24 Claims, 13 Drawing Sheets

HIGH VOLTAGE DIGITAL POWER AMPLIFIER

TECHNICAL FIELD

Aspects described herein generally relate to digital power amplifier architectures and, more particularly, to digital power amplifier designs that facilitate an increased output power.

BACKGROUND

Recently, there has been a shift towards digital TX (DTX) architectures due to their compact die area, scalability in advance CMOS processes, and improved power efficiency of switching digital PAs (DPAs). Conventional DPAs are based on switched capacitor (SC-DPA) topology, which is typically very efficient. However, conventional DPAs have drawbacks especially in terms of limited output power in that SC-DPA topology implements a low supply voltage due to the digital nature of the design and the use of thin gate digital devices to allow for high speed operation.

BRIEF DESCRIPTION OF THE DRAWINGS/FIGURES

The accompanying drawings, which are incorporated herein and form a part of the specification, illustrate the aspects of the present disclosure and, together with the description, further serve to explain the principles of the aspects and to enable a person skilled in the pertinent art to make and use the aspects.

The exemplary aspects of the present disclosure will be described with reference to the accompanying drawings. The drawing in which an element first appears is typically indicated by the leftmost digit(s) in the corresponding reference number.

DETAILED DESCRIPTION

Figure 1A:
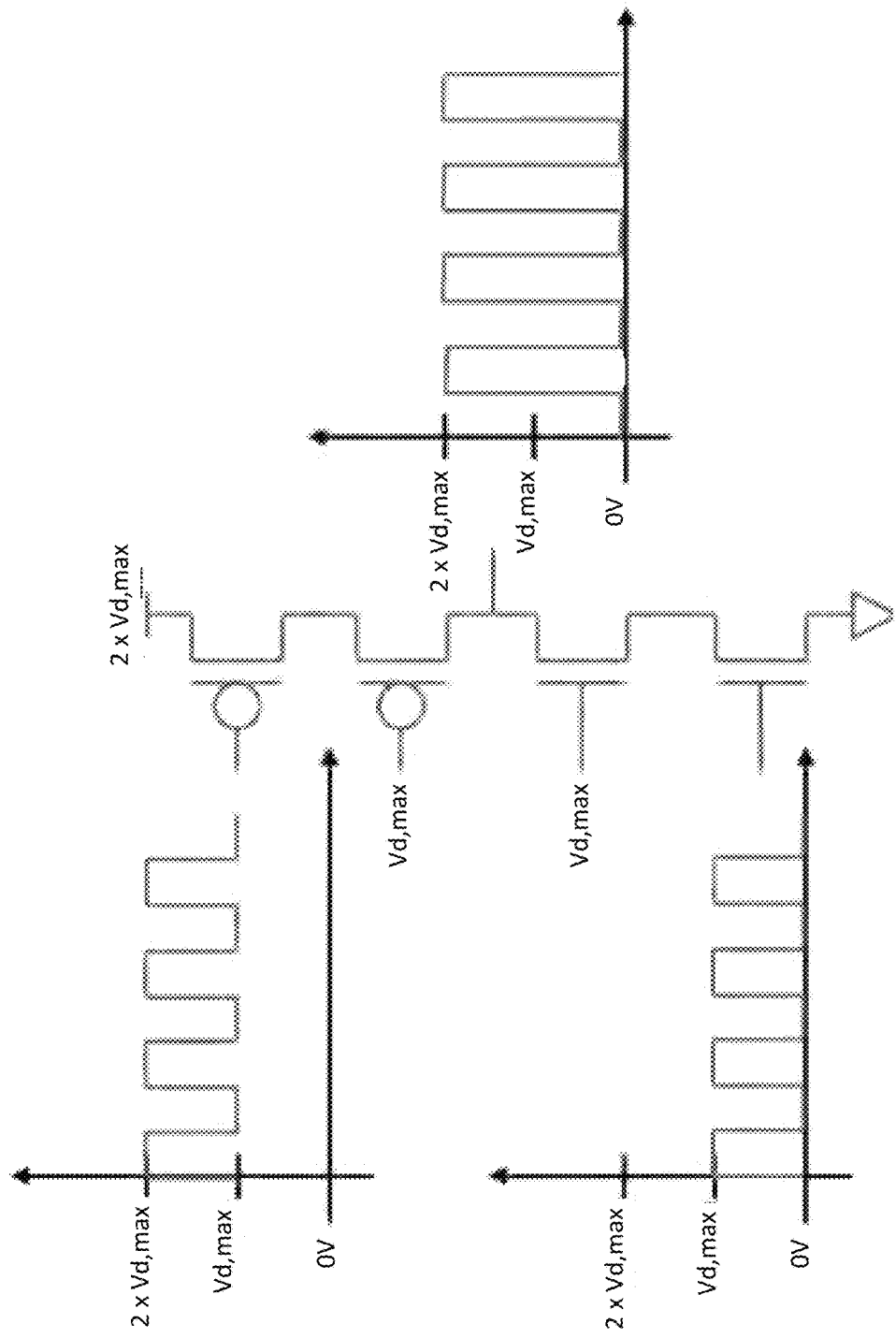
FIG. 1A illustrates a block diagram of conventional digital power amplifier (DPA) driver cell.

In the following description, numerous specific details are set forth in order to provide a thorough understanding of the aspects of the present disclosure. However, it will be apparent to those skilled in the art that the aspects, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring aspects of the disclosure.

Recently, there has been an increasing demand to increase transceiver transmit power for certain protocols, such as WiFi, to allow higher range across the Modulation Coding Scheme (MCS). Moreover, the use of DTX topologies in cellular applications has been limited due to the higher output power requirements of the cellular standards.

To address these issues, the disclosure proposes various techniques and circuit implementations that allow for a switched capacitor digital power amplifier (DPA) that operates using high supply voltage levels beyond twice the maximum voltage rating for any of the transistor terminals such as Vds/Vdg/Vsg. The notation used herein implements the term "max" after the relevant transistor voltage such as Vds,max; Vdg,max; Vsg,max. The general term Vd,max represents the maximum voltage allowed across any terminals of a single transistor device in accordance with a particular manufacturer's specification.

Previous approaches to increase digital transmitter power include the use of multiple (e.g. 2 and 4) core power combining techniques. However, maintaining the source voltage VDD~Vds,max as power is increased results in a higher current, which results in higher IR drops and more demanding requirements from the DC-DC current rating (handling), and thus impacts efficiency. Moreover, such approaches require an effective load impedance to be presented to each of the cores to be decreased, thus resulting in higher impact of matching network resistive losses (assuming similar Q in the technology). Such implementations also have practical limitations beyond 4 cores.

Other conventional approaches include using the power supply voltage VDD~2Vds,max in 2 stacked devices to increase the digital transmitter power by up to 6 dB compared to a regular single stack device, thus reducing the current consumption. However, typical platforms still require additional DC-DC converters to generate VDD (e.g. 16FF Vds,max~1.2V and a typical platform supply is 3.3V>2.4V). Thus, DC-DC current rating and efficiency impacts the overall efficiency and increases the cost of such designs. Furthermore, such techniques cannot be extended beyond VDD~2Vds,max due to reliability concerns.

The disclosure addresses these issues and describes an architecture that increases the switched capacitor DPA supply voltage using increased transistor stacking in the DPA driver cells, which results in an equal division of the voltage stress on each transistor. The reliability risk is eliminated by floating the internal (close to output) transistor gates, and through the use of a proper capacitive divider, allowing the transistor gates to track the output and reducing the stress over the oxide.

The architecture described herein advantageously allows for an increased voltage supply to support higher output power required to support longer distance transmissions. Although transistor stacking may appear to increase the Ron, there is a net efficiency improvement due to lower currents and an improvement in $I^2$Ron loss, and even in supply network IR drop and losses. Furthermore, the increased VDD results in higher load impedances, and thus a better trade-off of power/efficiency resulting in wider load pull circles and less sensitivity to changes in the load. Finally, the architecture described herein allows for the removal of high power DC-DC converters, resulting in a cost reduction, and facilitates an improvement to efficiency while in transmit mode.

Introduction to DPA Architecture

As will be further discussed below, the DPA architecture described herein may form part of an overall digital power amplifier design, which may be used to facilitate the transmission of data for any suitable device in accordance with any suitable type of communication protocol. Such DPA architectures may comprise an array of DPA cells, with each cell independently outputting a digital signal having a particular "swing" or a voltage range that is typically associated with the difference between a digital logic high voltage value and a digital logic low voltage value. The voltage range represents a peak-to-peak voltage amplitude that is proportional to that of one or more received input and/or control signals, and thus the ratio between the peak-to-peak amplitudes of the output and input signal represents the gain or amplification performed by the particular DPA cell, which may alternatively be referred to as a DPA driver cell.

The number of cells in the array may vary based upon the particular power requirements, application, communication protocol, etc., with typical numbers of cells being 64, 128, 256, etc. In any event, each of the cells within the array is digitally-controlled and outputs a signal that is coupled to a suitable digital-to-analog converter component, which then combines and converts each of the digital output signals to create an analog output signal for transmission via an appropriately coupled antenna. Such a digital-to-analog converter component may include known implementations of radio-frequency analog-to-digital converters (RF-DACs) that function to both sum the digital output signals and convert the summed signal to an analog output signal. The output signal thus has an amplitude that is a function of the number of cells in the array that are "on" or actively contributing to the desired analog output. In this way, DPAs function to selectively combine digital signals to achieve a desired output power via the selective combination of appropriate digital signals, thereby accommodating various modulation schemes.

To do so, each cell within the array functions to receive digital data streams such as in-phase digital data and quadrature-phase digital data, and outputs digital signals based upon these received digital data streams. The digital data signals output by each cell within the array thus vary over time as a function of the time-varying characteristics of the analog signal to be transmitted. The DPA architectures as discussed herein are described with respect to a single DPA driver cell in such a configuration of an array of DPA cells. The details and operation of the DPA in accordance with such a cell array architecture is generally known, and thus additional details regarding its operation is omitted for purposes of brevity.

FIG. 1A illustrates a block diagram 100 of conventional DPA driver cell. The DPA driver cell architecture as shown in FIG. 1A may be identified with a single DPA driver cell of a design that includes an array of such cells, as discussed above. As shown in FIG. 1A, a known concept is demonstrated to allow for an increase in the supply voltage of a DPA driver cell up to 2×Vd,max. Again, the parameter Vd,max is defined by a transistor manufacturer and on a per transistor basis. The Vd,max metric defines a maximum operating voltage that may be applied across any two terminals of a transistor without stressing the oxide of the transistor over the long term and resulting in premature failure. For instance, the metric Vd,max may represent the smallest of the various maximum operating voltage ratings for each combination of possible transistor terminals, which may be in the context of a CMOS transistor device in which the gate, drain, and source ports are provided. In such a case, the differential voltages between terminals are defined as Vds, Vgs, and Vgd. Per technology node, there is maximum rating Vd,max of the allowed voltage for these relative port voltages. Thus, as shown in FIG. 1A, the source voltage VDD that is coupled to the upper PMOS transistor is approximately equivalent to twice the Vd,max voltage to facilitate an increase in the peak-to-peak voltage amplitude of the digital signal output by the DPA driver cell 100 and enabling a higher power output by the associated DTX.

In accordance with this conventional configuration, an outer (i.e. upper) PMOS transistor and an outer (i.e. lower) NMOS transistor are each driven by a digital signal having a peak-to-peak amplitude of ~Vd,max. The digital signals as shown in FIG. 1A are provided at the respective gate terminals of each of the output PMOS and NMOS transistors as shown. The outer PMOS transistor is also coupled to a relevant supply voltage (VDD~2×Vd,max) via its source node as shown, and the outer NMOS transistor is also coupled to a common voltage VSS via its drain node as shown. This conventional architecture also includes inner PMOS and NMOS transistors operating in a "common gate" mode in which each gate voltage is set to a DC bias voltage of ~Vd,max. This allows for an output signal to be generated having a voltage swing of 2×Vd,max, which is then provided to the capacitive divider of the array of DPA driver cells to increase the output power. This structure also maintains the stress on the oxides of the transistors at Vd,max to avoid reliability risks.

However, such a configuration limits the output power of the DPA in accordance with the 2×Vd,max swing provided by the output signal. In other words, the DPA cell 100 as shown in FIG. 1A is limited to an amplification of twice that of the voltage swing (or peak-to-peak voltage levels) of the input signals. Therefore, other conventional approaches have been proposed to further increase the output voltage of the DPA driver cells.

Figure 1B:
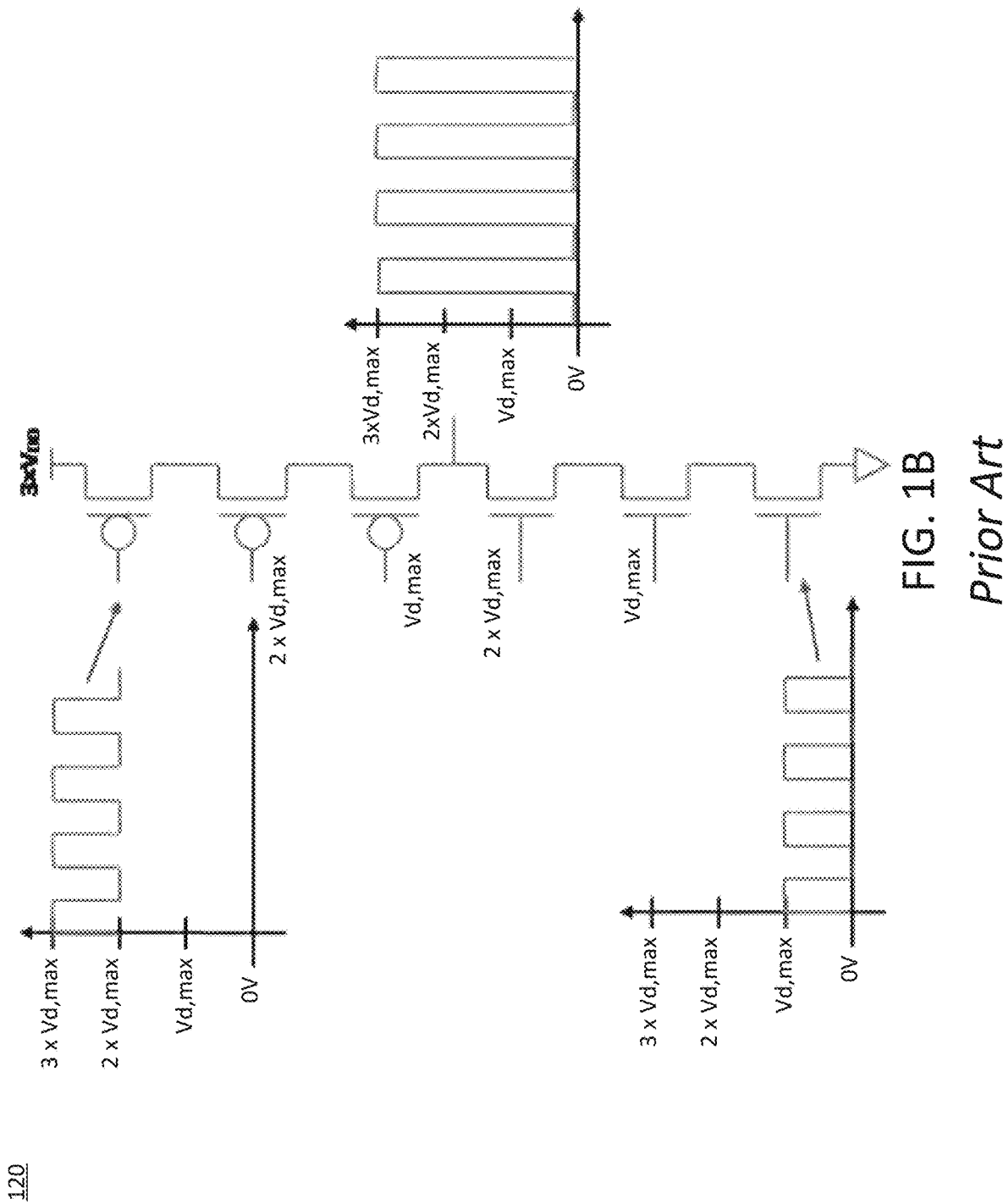
FIG. 1B illustrates a block diagram of another conventional DPA driver cell.

FIG. 1B illustrates a block diagram of another conventional DPA driver cell. The DPA driver cell architecture shown in FIG. 1B is an extension of the DPA driver cell 100 as shown in FIG. 1A. However, the conventional DPA cell architecture as shown in FIG. 1B uses an additional two transistors to support a supply voltage of Vdd~3×Vd,max, which enables the output signal to have a voltage swing reaching 3×Vd,max. To do so, the DPA driver cell 120 uses DC bias voltages provided to the gates of the inner PMOS and NMOS transistors of 2×Vd,max and Vd,max as shown in FIG. 1B. As a result, and irrespective of what fixed DC bias voltage is used, the inner PMOS and NMOS transistors will suffer from 2×Vd,max stress on their Gate/Drain oxides, thus violating the reliability condition dictated by the Vd,max metric as discussed above. This will lead eventually lead to oxide breakdown and/or a shortened life as a result of punch-through from the excessive Vds voltage during operation.

Figure 1C:
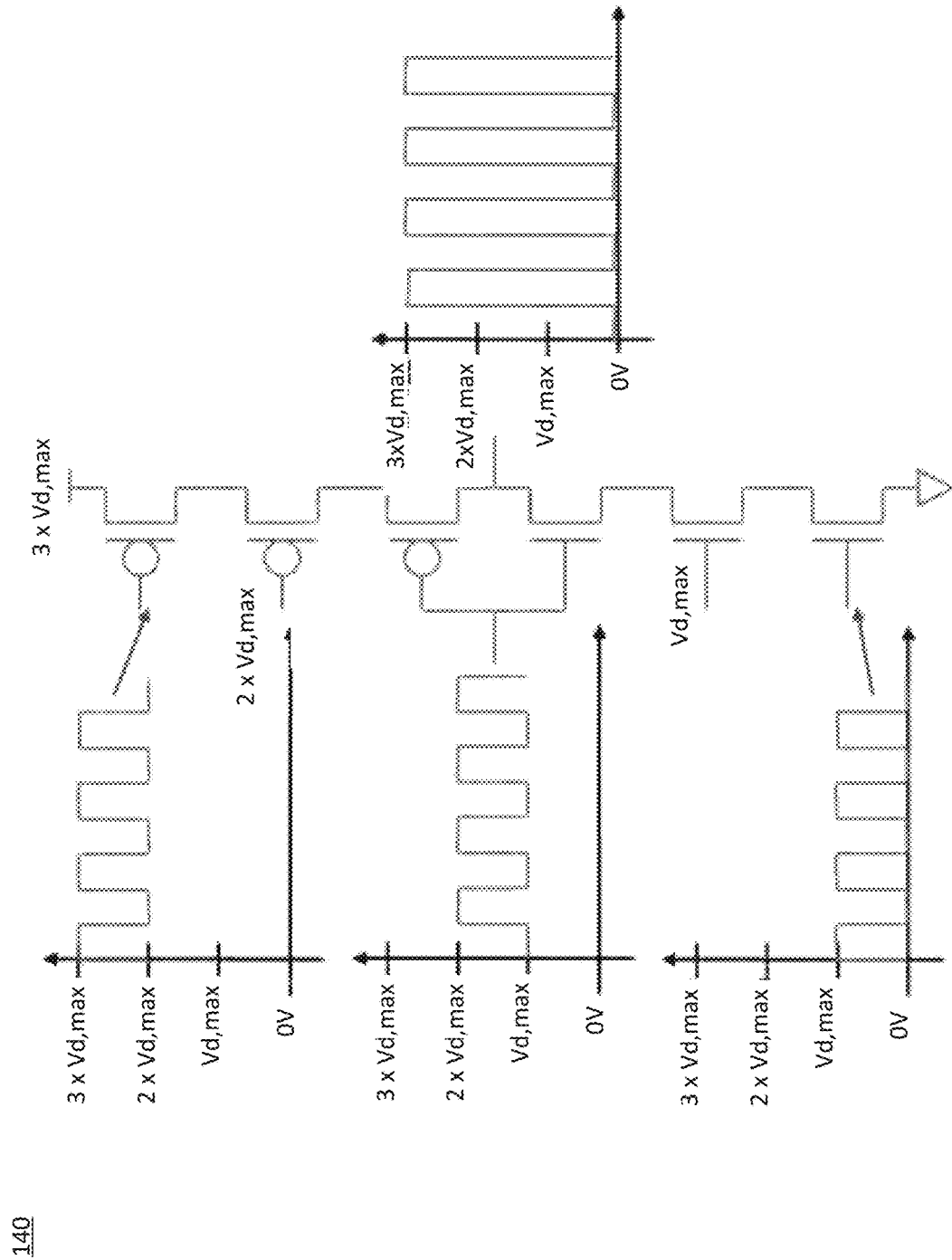
FIG. 1C illustrates a block diagram of an additional conventional DPA driver cell.

FIG. 1C illustrates a block diagram of another conventional DPA driver cell. The DPA driver cell architecture 140 is similar to the DPA cell architectures as shown in FIGS. 1A and 1B, and attempts to address the above problem of exposing the transistors to excessive voltages. As shown in FIG. 1C, the DPA driver cell 140 drives the outermost PMOS and NMOS transistors with in-phase signals having a voltage swing equal to Vd,max, as was the case in FIGS. 1A and 1B. However, instead of applying a fixed DC bias to each of the inner transistors as shown in FIG. 1B, the DPA driver cell 140 as shown in FIG. 1C uses DC bias voltages of 2×Vd,max and Vd,max at the gates of two of the transistors, whereas the innermost PMOS and NMOS transistors have their coupled gates driven by a third signal having a voltage swing equal to Vd,max but being out of phase with the other two input signals by 180 degrees. This results in the innermost signal being in-phase with the output signal having a voltage swing reaching 3×Vd,max. The phase relationship between the signals reduces the stress on the oxides to the allowed levels.

DPA Cell Architecture

Figure 2A:
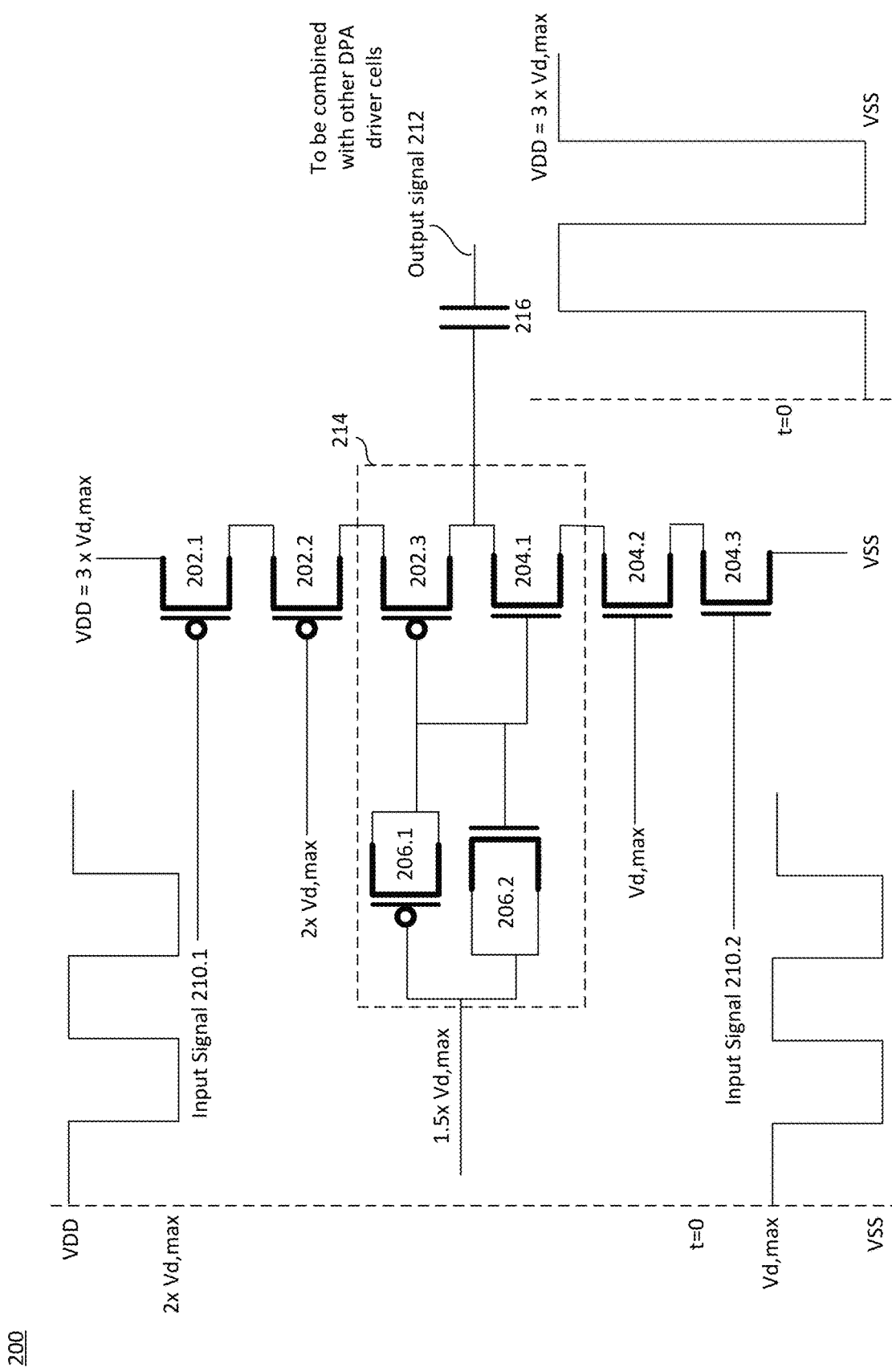
FIG. 2A illustrates a block diagram of a first DPA driver cell in accordance with the disclosure.

FIG. 2A illustrates a block diagram of a DPA driver cell, in accordance with the disclosure. As shown in FIG. 2A, the DPA driver cell 200 may form part of a digital power amplifier circuit, which includes a set or plurality of PMOS transistors 202.1-202.3, a set or plurality of NMOS transistors 204.1-204.3, and a set or plurality of transistors 206.1-206.2. The number of transistors and their connections to one another are shown in FIG. 2 in a non-limiting manner, and other configurations, types of transistors, and number of transistors may be implemented to realize the DPA driver cell 200, which may form one of several driver cells or buffers/inverters in an array of similar or identical cells that are implemented by a DTX architecture as noted above. The various transistors as discussed herein with respect to the DPA driver cells, pre-driver cells, level shifting circuits, etc., may be implemented in accordance with any suitable type of transistors, such as field-effect transistors or other suitable transistors depending upon the required speed, power handling, etc., for the particular application.

As shown in FIG. 2A, the DPA driver cell 200 includes three PMOS transistors 202.1-202.3, three NMOS transistors 204.1-204.3, and two transistors including a PMOS transistor 206.1 and an NMOS transistor 206.2. The various transistors 202, 204, 206 may be implemented as any suitable type of transistor configured to provide voltage switching in accordance with any suitable type of data communication protocol, and may operate in accordance with any suitable switching speeds. The various transistors of the DPA driver cell 200 have a maximum operating voltage specification of Vd,max, which is identified with a maximum voltage across any two terminals of each transistor as noted above. In the configuration as shown in FIG. 2A, the DPA driver cell 200 is driven with two in-phase input signals 210.1, 210.2, each having a voltage swing or peak-to-peak voltage equal to or approximately equal to (within 1%, 2%, 5%, 10%, etc.) the Vd,max voltage value. The input signals 210.1, 210.2 are coupled to a respective gate of the PMOS transistor 202.1 and NMOS transistor 204.3, with each signal 210.1, 201.2 having a respective voltage range that varies between an upper voltage level (VDD or 3×Vd,max for input signal 210.1 and Vd,max for input signal 210.2) and a lower voltage level (2×Vd,max for input signal 210.1 and VSS for input signal 210.2). Thus, the input signals 210.1, 210.2 may be considered one or more of time-varying digital signals, time-varying analog signals, and/or time-varying control signals, depending upon the particular application, which in any case vary between a particular high voltage level (which may be a logic high voltage level or other suitable reference voltage) and a particular low voltage level (which may be a logic low voltage level or other suitable reference voltage).

However, unlike the conventional implementations of the DPA driver cells as shown in FIGS. 1A-1C, the DPA driver cell 200 does not require additional DC-DC voltage sources to provide the DC bias voltages at the gates of the transistors 202.2 and 204.2. Instead, and as further discussed herein, each of the transistors 202.2 and 204.2 has a floating gate configuration in which the respective gate of each transistor is not coupled to a DC-DC voltage source but instead develops or self-generates a DC bias voltage (i.e. 2×Vd,max and Vd,max) as a result of the circuit configuration as shown in FIG. 2A. Furthermore, the gate of each of the PMOS transistor 202.3 and the NMOS transistor 204.1 are coupled to one another and also have a floating gate configuration, i.e. the gates are not actively driven by a signal or DC-DC voltage source. This configuration advantageously enables the transistors 202.3, 204.1 to generate the output signal 212 in a manner such that the voltage at the gate terminals tracks the voltage of the output signal 212, which is 180 degrees output of phase with the input signals 210.1, 210.2, thereby reducing stress on the oxides.

Moreover, this configuration enables the DPA driver cell 200 to utilize a single DC-DC converter or voltage source to supply VDD for the PMOS transistor 202.1 and VSS for the NMOS transistor 204.3. In other words, this enables the DPA driver cell 200 to implement only a single DC-DC converter to supply the voltage sources VDD and VSS. This is a distinct advantage over the conventional implementations of the DPA driver cells as shown in FIGS. 1A-1C, which require separate DC-DC converters to supply the DC bias voltages, as the DC bias voltages are not self-generating in those configurations as the gates of the transistors for the conventional DPA driver cells 100, 120, and 140 are not floating.

The DPA driver cell 200 self-generates the DC bias voltages as a result of a feedback capacitive ratio formed via the coupling of the transistors 206.1, 206.2 to the floating gate connection of the transistors 202.3, 204.1. That is, the DPA driver cell as shown in FIG. 2A implements a feedback capacitive ratio that is generated between the gate-drain capacitance of the PMOS transistor 202.3 and the NMOS transistor 204.1, i.e. between the output node of the transistors 202.3, 204.1 and the Vd,max/2 biased transistors 206.1, 206.2 (which may be the same size as one another but larger than the transistors 202.3, 204.1 to achieve this larger capacitance). The capacitive ratio is thus formed via the 2× capacitance due to the gate-source and gate-drain capacitances of the transistors 206.1, 206.2.

Figure 2B:
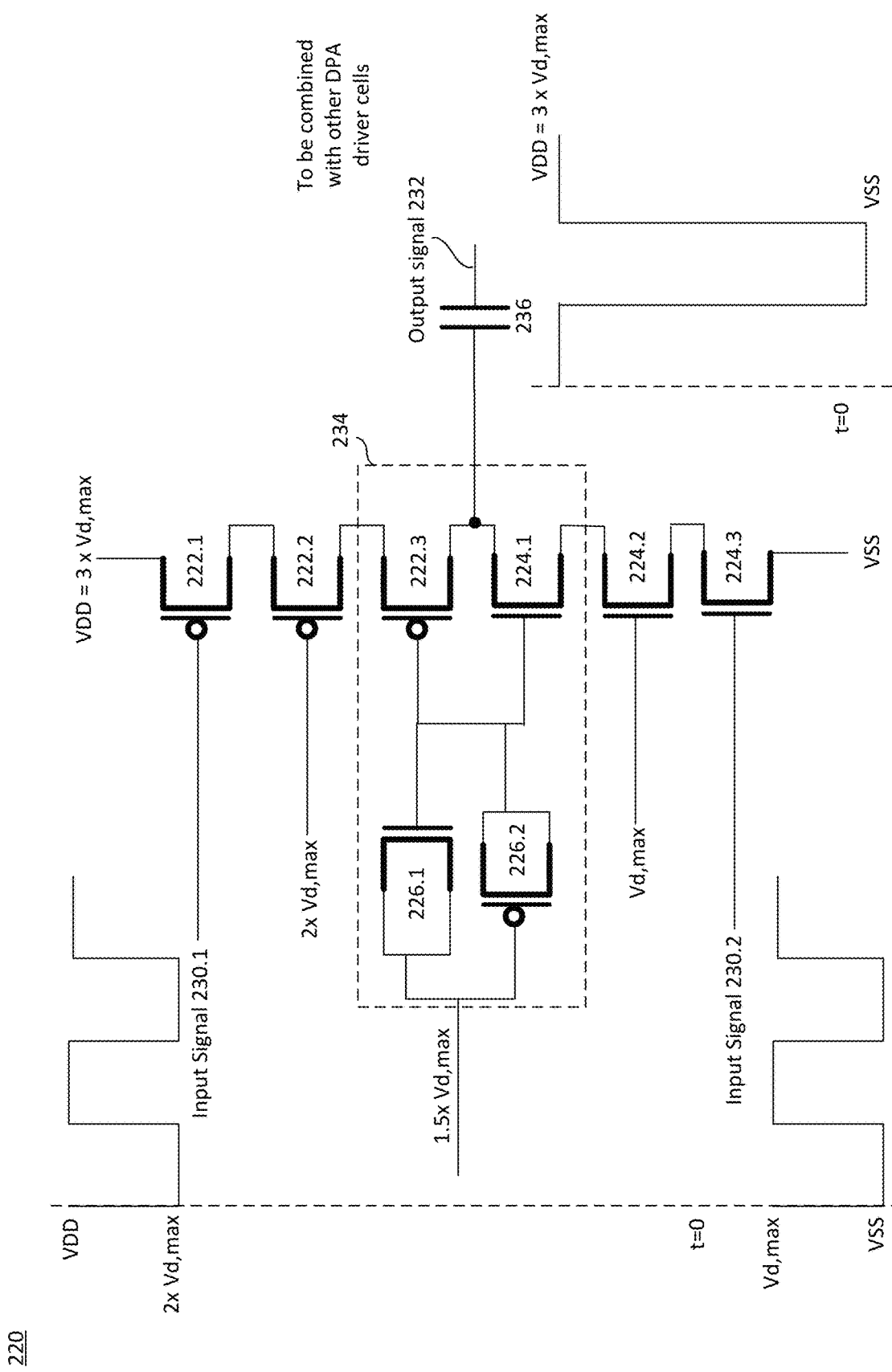
FIG. 2B illustrates a block diagram of a second DPA driver cell in accordance with the disclosure.

The DPA driver cell 200 is shown in FIG. 2A as a part of a single-ended DTX implementation. However, the DPA driver cell 200 may additionally or alternatively be implemented as part of a differential signal DTX architecture. In accordance with such implementations, the DPA driver cell 200 may be referred to as a P-channel DPA driver cell, and work in conjunction with an N-channel DPA driver cell, which is illustrated in FIG. 2B. Of course, the DPA driver cell 220 as shown in FIG. 2B may alternatively be implemented as part of a single-ended signal DTX design.

In any event, the DPA driver cell 220 functions in a similar manner as the DPA driver cell 200, and common elements between the two are omitted for brevity. The DPA driver cells 200, 220 may have an identical architecture and configuration as one another, but receive input signals 210.1, 210.2 and 230.1, 230.2 having 180 degree phase shifts as shown in FIGS. 2A-2B, thus generating output signals 212, 232 having 180 degree phase shifts with respect to one another. That is, when used as part of a differential signal DTX implementation, the P-channel DPA driver cell 200 and the N-channel DPA driver cell 220 may be driven with input signals having a 180 phase difference between one another, resulting in the output signals 212, 232 likewise having a 180 degree phase offset between one another, with each of the DPA driver cells 200, 220 generating respective output signals 212, 232 that represent a 180 degree phase shift from their respective input signals 210.1, 210.2 and 230.1, 230.2. Each of the output signals 212, 232 for the DPA driver cells 200, 220 is further coupled to a capacitor 216, 236 as shown in FIGS. 2A-2B, which represents a multiplicative capacitor that is present on the output of each DPA driver cell 200, 220 within the array as discussed above.

Figure 2C:
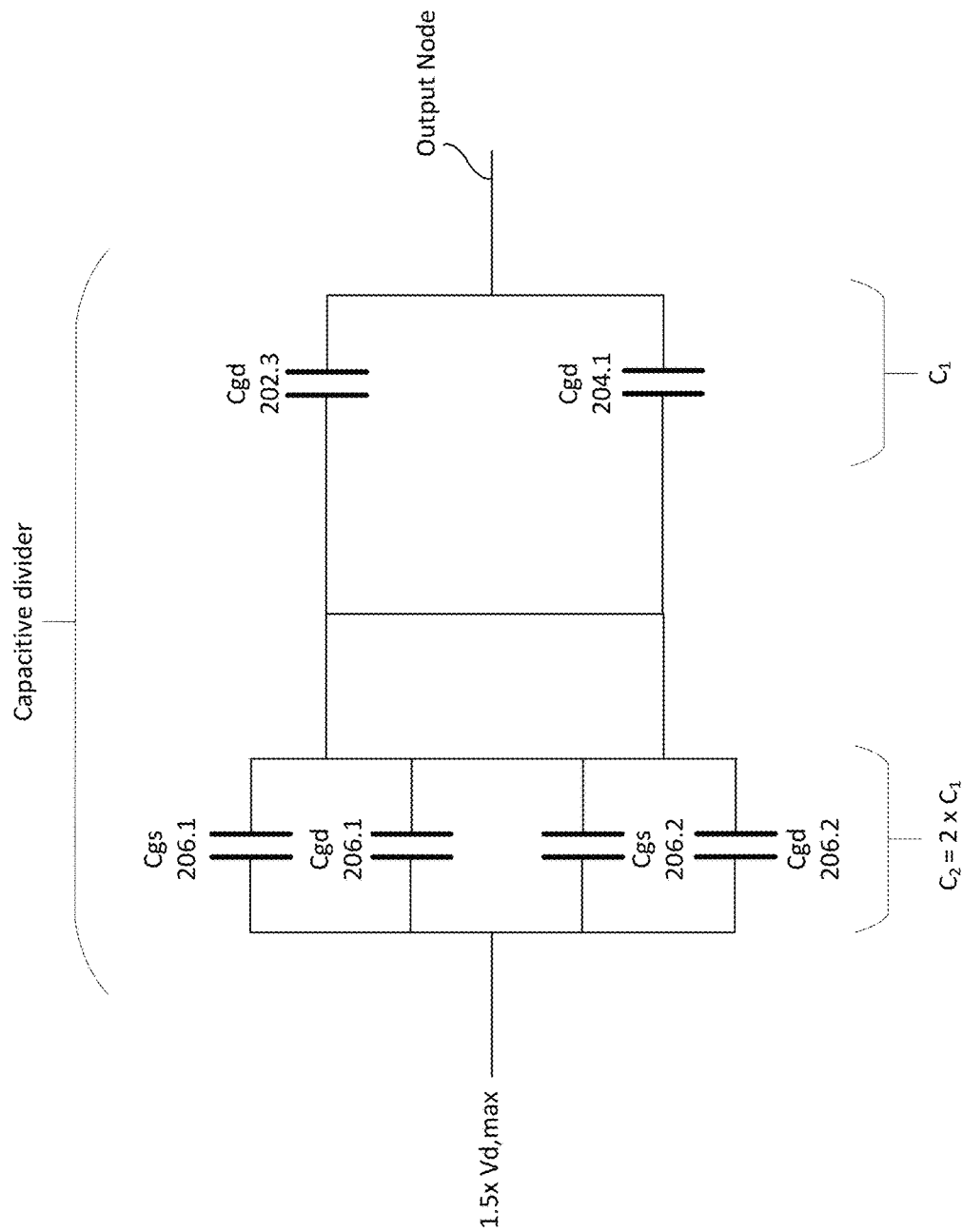
FIG. 2C illustrates a block diagram of a capacitive divider associated with the DPA driver cell as shown in FIG. 2A, in accordance with the disclosure.

FIG. 2C illustrates a block diagram of a capacitive divider associated with either of the DPA driver cells 200, 220 as shown in FIGS. 2A and 2B, respectively, which provide the capacitive feedback ratio for each respective DPA cell. The capacitive divider 240 is shown in FIG. 2C with reference to the components of the DPA cell 200 as shown in FIG. 2A, although the illustration applies equally to the DPA driver cell 220 and the analogous transistors of the DPA driver cell 220. The transistors 206.1-206.2 may be substantially the same as one another (the same manufacturer, part number, type, size, etc.) and thus have substantially the same intrinsic capacitance values (within some manufacturing tolerances such as 1%, 2%, 5%, etc.). As a result, the transistors 206.1, 206.2 each have an equal intrinsic gate-source (Cgs) and gate-drain (Cgd) capacitance formed between their respective terminals as a result of the layout of these components (with Cgs and Cgd also being equal to one another). This is true for each of the transistors 206.1, 206.2. Thus, the transistors 206.1, 206.2 need not be connected in the configuration as shown in FIG. 2A to provide the same capacitive ratio, and may alternatively be coupled in a different arrangement in which the gate terminals of each of the transistors 206.1, 206.2, 202.3, and 204.1 are coupled to one another (i.e. switching the connections for transistor 206.1). Furthermore, each of the transistors 202.1-202.3 and 204.1-204.3 may be substantially the same as one another (the same manufacturer, part number, type, size, etc.) and thus have substantially the same intrinsic capacitance values (within some manufacturing tolerances such as 1%, 2%, 5%, etc.). As a result, the transistors 202.3, 204.1 each have equal intrinsic gate-drain capacitances (and gate-source capacitances, which are also equal to their gate-drain capacitances).

Figure 3:
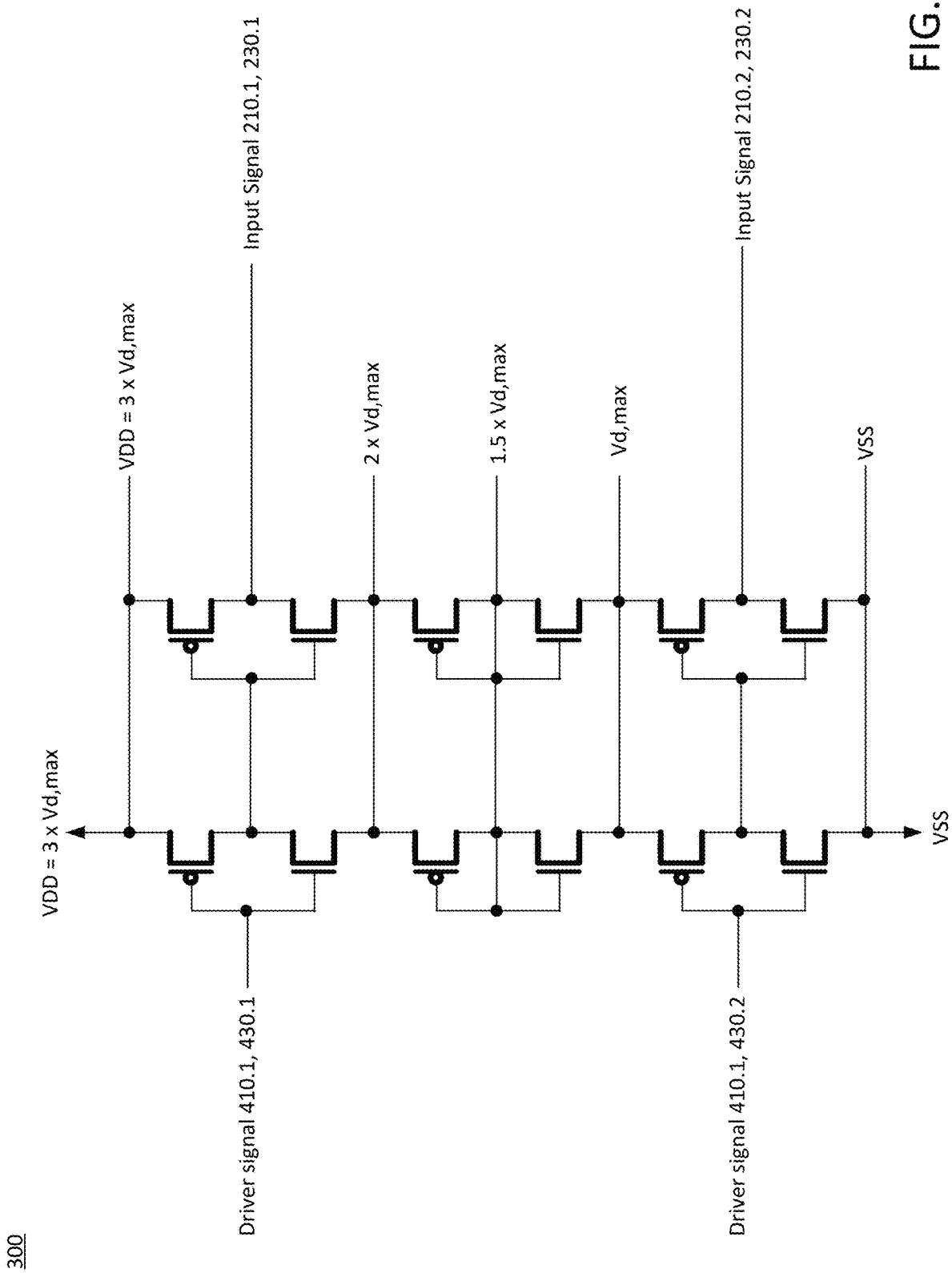
FIG. 3 illustrates a DPA pre-driver cell in accordance with the disclosure.

The DPA driver cells 200, 220 may thus implement any suitable number of transistors 202, 204, and 206 (and 222, 224, and 226 as applicable) such that a desired capacitive feedback ratio is achieved. For the DPA driver cell 200 configuration as shown in FIG. 2A, the capacitive ratio is 2:1 as a result of the transistors 206.1, 206.2 having a capacitance of $C_2=4\times Cgd$ (assuming Cgs and Cgd are equal), whereas the transistors 202.3, 204.1 have a capacitance of $C_1=2\times Cgd$. In other words, the capacitive feedback ratio is such that $C_1=2C_2$. In accordance with such a configuration, a capacitive divider as shown in FIG. 2C is formed between the transistors 206.1, 206.2 and the transistors 202.3, 204.1 to define the feedback capacitive ratio of 2:1. This capacitive feedback ratio also enables the self-generation of the DC bias voltage that is half of the maximum voltage Vd, max (1/3 of VDD) as shown in FIG. 3 (1.5×Vd,max) as a result of the capacitive coupling between the input and output of the DPA driver cell 200. This enables AC feedback for the DPA driver cells 200, 220 via this coupled capacitive feedback path. The capacitive feedback ratio may be set by selecting the appropriate number, type, and/or size of transistors 202, 204, 206 (or analogous transistors 222, 224, 226 for the DPA driver cell 220). The transistors 206.1, 206.2 may be selected to be a larger size such that their intrinsic capacitance values are larger than that of the transistors 202, 204, or may be identical to the transistors 202, 204 but be greater in number to stack their capacitances as desired.

As a result of the feedback capacitive ratio, the DPA driver cells 200, 220 also achieve the desired amplification of the input voltage signals 210.1, 210.2 or 230.1, 230.2, as the case may be. That is, and using the DPA driver cell 200 in this scenario for illustrative purposes, the DPA driver cell 200 generates an output signal 212 in accordance with the feedback capacitive ratio such that the output signal 212 has a voltage swing or range that varies between the upper voltage level of the input signal 210.1 (VDD) and the lower voltage level of the input signal 210.2 (VSS). Thus, as a result of the floating gate configuration of the transistors 202.3, 204.1, the gates of the transistors 202.3, 204.1 track the output signal 212. This eliminates stress on each of the transistors in the DPA driver cells 200, 220, as no transistor in the DPA driver cell 200, 220 develops a voltage across any two respective terminals that exceeds the peak-to-peak amplitude (i.e. swing or voltage range) of the input signals 210.1, 210.2 (or 230.1, 230.2) which is Vd,max as shown in FIG. 2A.

Figure 2D:
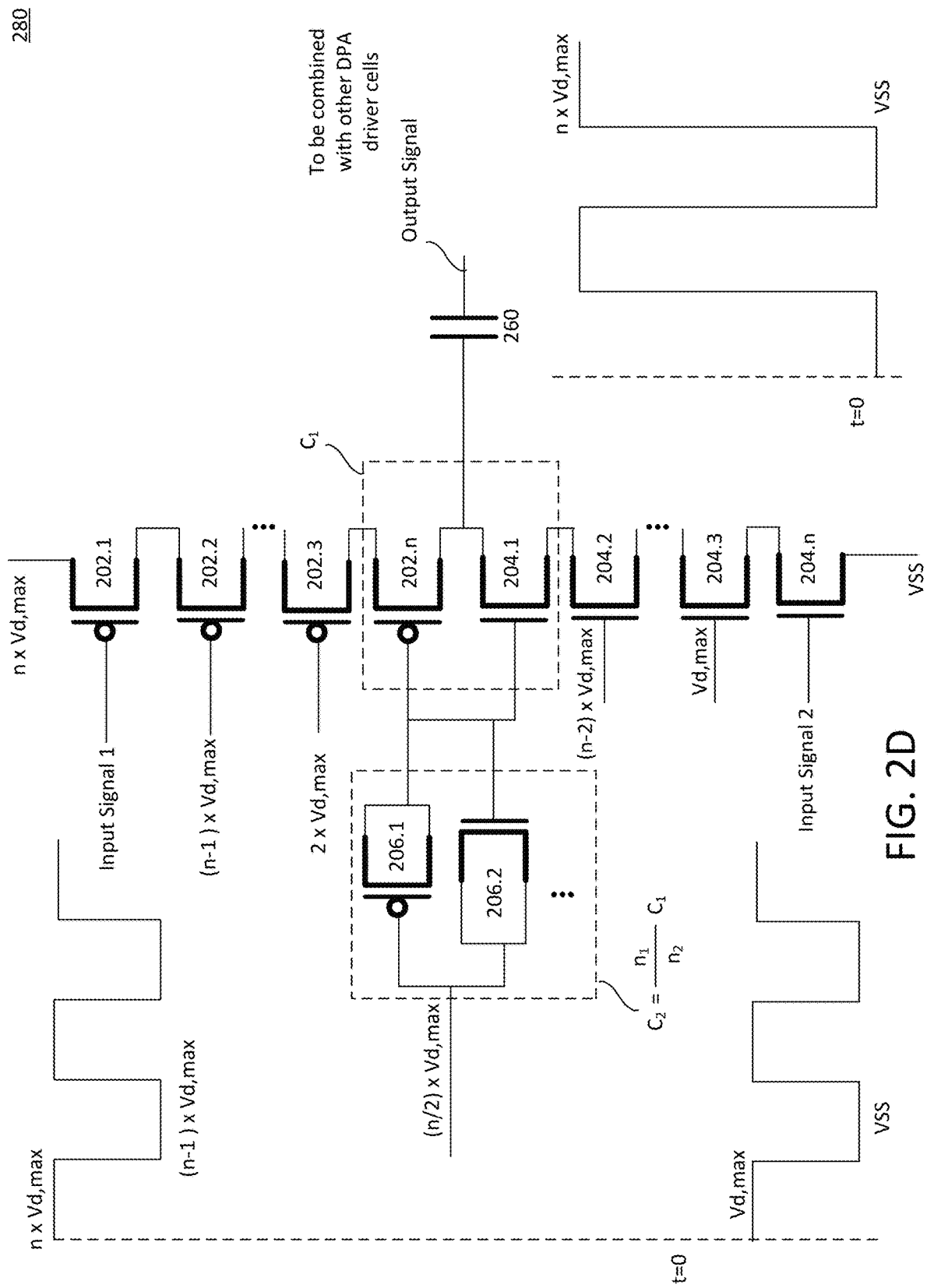
FIG. 2D illustrates a block diagram of an extension of the DPA driver cell as shown in FIG. 2A, in accordance with the disclosure.

FIG. 2D illustrates a block diagram of a DPA driver cell associated with a digital power amplifier (DPA) architecture, in accordance with the disclosure. The DPA driver cell 280 as shown in FIG. 2D includes similar components as shown and discussed above with reference to the DPA driver cells 200, 220 as shown in FIGS. 2A and 2B. The DPA driver cell 280 illustrated in FIG. 2D is an extension of the DPA driver cell 200 as shown in FIG. 2A, although the concepts discussed herein with respect to the extension of the DPA cell 200 is equally applicable to the extension of the DPA cell 220. Common and analogous elements between the DPA driver cells 200, 220 and the DPA driver cell 280 are not described further for purposes of brevity.

The DPA driver cell 280 illustrates an extension of the DPA driver cell 200 and how a DPA driver cell may be implemented generally with any suitable number of transistors to facilitate receiving two in-phase input signals having a voltage range or swing (i.e. peak-to-peak amplitudes) of Vd,max (or other suitable voltage ranges). The DPA driver cell 280 also facilitates any suitable level of amplification as a function of the number n of PMOS and NMOS transistors 202, 204, respectively. For instance, the output signal as shown in FIG. 2D provides a peak-to-peak amplitude that is a multiple 'n' of the peak-to-peak amplitude of the two input signals.

Again, 'n' as shown in FIG. 2D is equal to the number of the PMOS transistors 202.1-202.$n$, which is equal to the number of NMOS transistors 204.1-204.$n$. In this configuration, the number and type of transistors 206.1, 206.2 may be selected having any suitable intrinsic gate-source and gate-drain capacitances to provide a desired capacitive feedback ratio for the capacitive divider. As shown in FIG. 2D, which is a non-limiting illustration, it is assumed that the capacitive divider is set such that $$C_1 = \frac{n_1}{n_2}C_2,$$

or alternatively expressed to match the relationship in FIG. 2C as $$C_2 = \frac{n_2}{n_1}C_1$$

to allow the appropriate feedback that protects the transistor's oxide stress below Vd,max. In this representation of the desired capacitive feedback ratio for the capacitive divider, the ratio of sizing $$\frac{n_1}{n_2}$$

between the transistors 206.1, 206.2 and the transistors 202.$n$, 204.1 ensures the proper capacitive divider feedback of the output voltage to maintain the transistors free from stress. This is a design choice and can be tuned during the design procedure to ensure long term reliability and performance. The self-generating DC bias voltage at the gate of the transistor 206.1 and the drain-source terminals of the transistor 206.2 is generally represented in FIG. 2D as half the number n of the PMOS transistors 202.1-202.$n$, which is equal to the number of NMOS transistors 204.1-204.$n$, and thus is equal to a proportion of (n/2) of the supply voltage VDD. Extending this generality, the generated output signal would have a voltage swing or peak-to-peak amplitude of n×Vd,max. Such implementations are mainly limited by avalanche breakdown of the particular transistors that are used.

Optional Pre-Driver Cell

FIG. 3 illustrates a DPA pre-driver cell, in accordance with the disclosure. The DPA pre-driver cell 300 as shown in FIG. 3 is an optional component that may be implemented to generate the bias voltages used by the DPA driver cell architecture as discussed herein with reference to FIGS. 2A-2D. As shown in FIG. 3, the DPA pre-driver circuit 300 functions as a buffer circuit for the input signals 210.1, 210.2 or 230.1, 230.2, as the case may be, which are generated using the driver signals 410.1, 410.2, 430.1, 430.2, which may be provided by a level-shifting circuit or other suitable DPA driving circuit, as further discussed below. The use of the DPA pre-driver circuit 300 mainly depends on the sizing of the output stage of the DPA driver cell 200, 220 and a tradeoff between a desired reduction in the amount of components and die space for a particular DPA design. That is, some implementations may include a DPA driver cell 200, 220 having an output stage(s) small enough to be driven directly by a DPA driving circuit such as a level shifter. For larger sized output stages, it may be desirable to add the optional DPA pre-driver cell for stability and to ensure adequate current sourcing is achieved.

Although the DPA pre-driver circuit 300 may be used to generate the bias voltages as shown in FIG. 3, which may then be coupled to the DPA driver cell 200, 220, this may still be achieved via a single DC-DC converter or other suitable power supply. That is, using the illustrated pre-driver cell 300 as shown in FIG. 3, a DC-DC converter may function to provide the voltages VDD and VSS. Like several of the gates of the transistors of the DPA driver cell 200, 220, the middle four transistors as shown in FIG. 3, which are implemented by the pre-driver cell 300, are not actively driven by the driver signals 410.1, 410.2, 430.1, 430.2, and thus are likewise floating. Thus, the remaining bias voltages 2×Vd,max, 1.5×Vd,max, and Vd,max are self-generated bias voltages that result from the stacked architecture of the pre-driver cell 300 or, when not used, the stacked architecture of the DPA driver cell 200, 220 as noted above.

Therefore, the need for additional DC-DC converters or other voltage supplies is obviated and the self-generated bias voltages may be generated by leveraging the floating gate architecture of the transistors of the pre-driver cell 300 and/or the DPA driver cell 200, 220 as applicable. Moreover, due to the floating gate architecture of the DPA driver cell 200, 220 as discussed herein, the self-generated DC bias voltages (regardless of whether these are generated via the pre-driver cell 300 or the DPA driver cell 200, 220), are sufficient to provide the output signal with the desired voltage range due to the low current requirements enabled by the floating transistor gates.

Level Shifting Circuit

Figure 4:
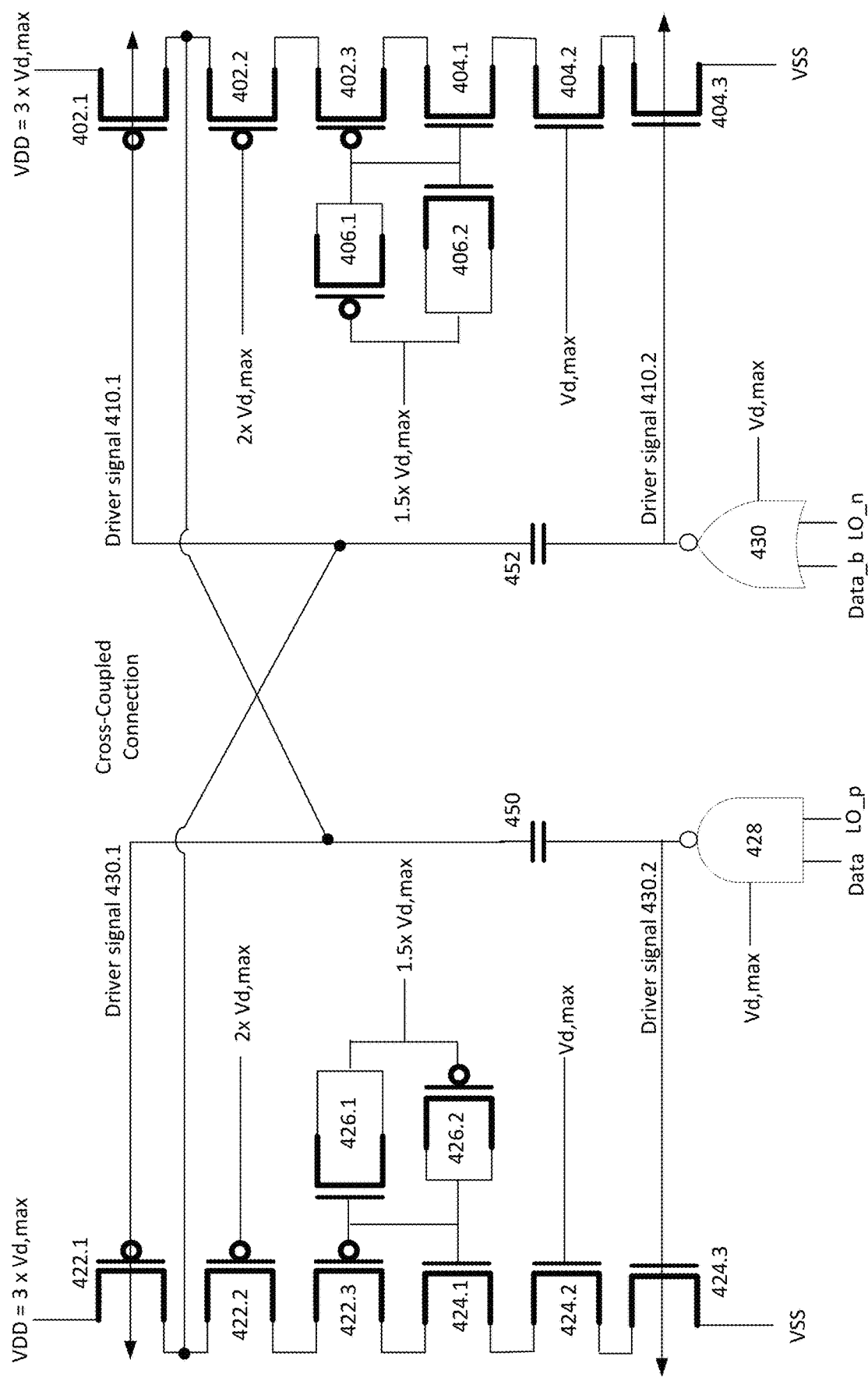
FIG. 4 illustrates a DPA level shifting circuit in accordance with the disclosure.

FIG. 4 illustrates a DPA level shifting circuit, in accordance with the disclosure. The level shifting circuit 400 generates a set of driver signals 410.1, 410.2, 430.1, 430.2 as discussed above with reference to FIG. 3, which provide level-shifted versions of the received data signals. The DPA level shifting circuit 400 may include two different sets of transistors, each having the same configuration as the transistors discussed herein with reference to the DPA driver cells 200, 220. That is, the set of driver signals 410.1, 410.2, 430.1, 430.2 are shown in FIG. 4 with respect to a differential signal DTX implementation, with each half of the level shifting circuit 400 supplying driver signals to a different DPA cell associated with each respective half of the differential signal architecture. The right side of the DPA level shifting circuit 400 as shown in FIG. 4 may have a configuration of transistors identical to or substantially similar to those associated with the DPA driver cell 200, which may be referred to as a p-channel driver cell 200 in this scenario. Further, the driver signals 410.1, 410.2 may be supplied to the p-channel DPA cell 200 and identified with the input signals 210.1, 210.2 as shown in FIG. 2A. The left side of the DPA level shifting circuit 400 as shown in FIG. 4 may have a configuration of transistors identical to or substantially similar to those associated with the DPA driver cell 220, which may be referred to as an n-channel driver cell 220 in this scenario. Further, the driver signals 430.1, 430.2 may be supplied to the n-channel DPA cell 220 and identified with the input signals 230.1, 230.2 as shown in FIG. 2B. Again, the DPA driver cells 200, 220 may have an identical architecture and/or configuration, and thus the left and right sides of the DPA level shifting circuit 400 may likewise have an identical architecture and/or configuration, with the difference between their operation being the result of the signals received at each respective input as further discussed herein.

The DPA level shifting circuit 400 also generates the DC bias voltages, which in the non-limiting illustration of FIG. 4 includes the level-shifted DC bias voltages of 2×Vd,max, 1.5×Vd,max, and Vd,max. Each of the DC bias voltages and the driver signals 410.1, 410.2, 430.1, 430.2 may be coupled to the p-channel DPA driver cell 200 and the n-channel DPA driver cell 220 directly or via the DPA pre-driver cell 300 as shown and discussed herein with reference to FIG. 3. In other words, the DPA pre-driver cell 300, when implemented, functions as a buffer circuit between the DPA level shifting circuit 400 and each of the p-channel DPA driver cell 200 and n-channel DPA driver cell 220. Of course, the DPA level shifting circuit 400 may also be implemented with DPA driver cells 200, 220 in a single-ended signal DTX implementation versus a differential signal implementation.

The DPA level shifting circuit 400 includes a logical NAND gate 428 and a logical NOR gate 430, each of which utilizes the Vd,max voltage as its supply voltage. The NAND gate 428 receives clocked data (data) at one of its inputs as well as a local oscillator (LO) signal for the p-channel (LO_p). The clocked data signals data and data_b data streams provided by a suitable upstream component of the DTX device, such as a high-speed digital interface or local digital decoder, converting the output of a digital front end (DFE). The DFE may be implemented as a chip interface or any suitable off-chip device configured to send the data/data_b streams, which may constitute commands or digital instructions. In any event, the data and data_b signals may represent digital data that is to be transmitted, such as in-phase and quadrature phase data streams. Alternatively, and if a polar transmitter architecture is implemented, the data/data_b digital data streams may constitute commands representing an amplitude word. The amplitude word may be a representation of SQRT(I^2+Q^2), in which I and Q are the in-phase and quadrature data streams. The data and data_b data streams may represent inversions of one another, i.e. these data signals may be phase-shifted 180 degrees with respect to one another.

The LO_n and LO_p signals may be equal in frequency and phase-shifted from one another by 180 degrees. The NAND gate 428 thus generates at its output the driver signal 430.2, which is represents the result of a logical NAND function applied to the data and LO_n clock signals. Due to its supply voltage of Vd,max, the NAND gate 428 generates the driver signal 430.2 having a voltage swing (i.e. peak-to-peak amplitude) approximately equal to the supply voltage of Vd,max. Likewise, the NOR gate 430 generates at its output the driver signal 410.2, which is represents the logical NOR function applied to the data_b and LO_p clock signals. Thus, the NOR gate 430 generates the driver signal 410.2 having a voltage swing (i.e. peak-to-peak amplitude) approximately equal to the supply voltage of Vd,max.

The driver signals 430.2, 410.2 are coupled to the gate terminals of each of the transistors 424.3, 404.3, respectively. The driver signal 410.2 is also coupled to the gate terminal of the transistor 204.3 of the p-channel DPA driver cell 200 as shown in FIG. 2A, either directly or via coupling to the DPA pre-driver cell 300 as noted above with reference to FIG. 3. Moreover, the driver signal 430.2 is also coupled to the gate terminal of the transistor 224.3 of the n-channel DPA driver cell 220 as shown in FIG. 2B, either directly or via coupling to the DPA pre-driver cell 300 as noted above with reference to FIG. 3. Thus, the driver signals 410.2, 430.2 may be identified in this way with the input signals 210.2, 230.2 as shown and described above with reference to the p-channel DPA driver cell 200 and the n-channel DPA driver cell 200 as shown in FIGS. 2A-2B, respectively.

As a result of the logical function applied by each of the NAND gate 428 and the NOR gate 430, the driver signals 410.1, 410.2 have the same phase as one another, and the driver signals 430.1, 430.2 have the same phase as one another. However, the driver signals 410.1, 410.2 are phase-shifted from the driver signals 430.1, 430.2 by 180 degrees, which is also illustrated in FIGS. 2A-2B with respect to the input signals 210.1, 210.2, 230.1, 230.2. The level shifting circuit 400 also includes capacitors 450, 452, which function as feedback capacitors to improve the speed of the level-shifting circuit 400. To do so, and as shown in FIG. 4, the capacitors 450, 452 function to apply a "shortcut" path to change the voltage level output by the PMOS transistors 402.1, 422.1. Thus, when the NOR gate 430 and the NAND gate 428 are switched, their respective output signals 410.2, 430.2 drive both the lower NMOS transistors 404.3, 424.3 and the upper PMOS transistors 402.1, 422.1 via the capacitors 450, 452. The level shifting circuit 400 also implements a cross-coupling configuration as shown in FIG. 4, which couples the driver signals 430.2, 410.2 to the opposite n-channel and p-channel driving sides of the level shifting circuit 400. As shown in FIG. 4, the driver signal 430.2 is coupled (after the capacitor 450) to the drain node of the transistor 402.1, and the driver signal 410.2 is coupled (after the capacitor 452) to the drain node of the transistor 422.1.

Due to the 180 degree phase difference between the driver signals 430.2, 410.2, this prevents the transistors 402.1, 422.1 from having a voltage across any of their respective gate, drain, or source terminals exceeding Vd,max. Furthermore, the effect of the coupling of the out-of-phase signals in this manner enables the output of the transistors 402.1, 422.1 to have the same voltage swing (i.e. peak-to-peak amplitude) as the driver signals 410.2, 430.2, respectively, but DC level-shifted. That is, the driver signals 410.1, 430.1 may each vary between 2×Vd,max and 3×Vd,max as the source node of each of the transistors 402.1, 422.1 is coupled to the higher voltage level of 3×Vd,max as shown in FIG. 4.

The DPA level shifting circuit 400, like the DPA driver cells 200, 220, self-generates the DC bias voltages as a proportion of the supply voltage VDD and the number of transistors 402, 404, 422, and 424. Again, this is a result of the floating gate configuration of the transistors 402, 404, 422, 424. The illustrated DPA level shifting circuit 400 as shown in FIG. 4 is non-limiting, and may include any suitable number of transistors to meet the needs of a particular design, application, and/or to match a configuration of the DPA driver cells 200, 220 and provide the appropriate number and level of DC bias voltages.

A Differential DPA Driver Cell

Figure 5:
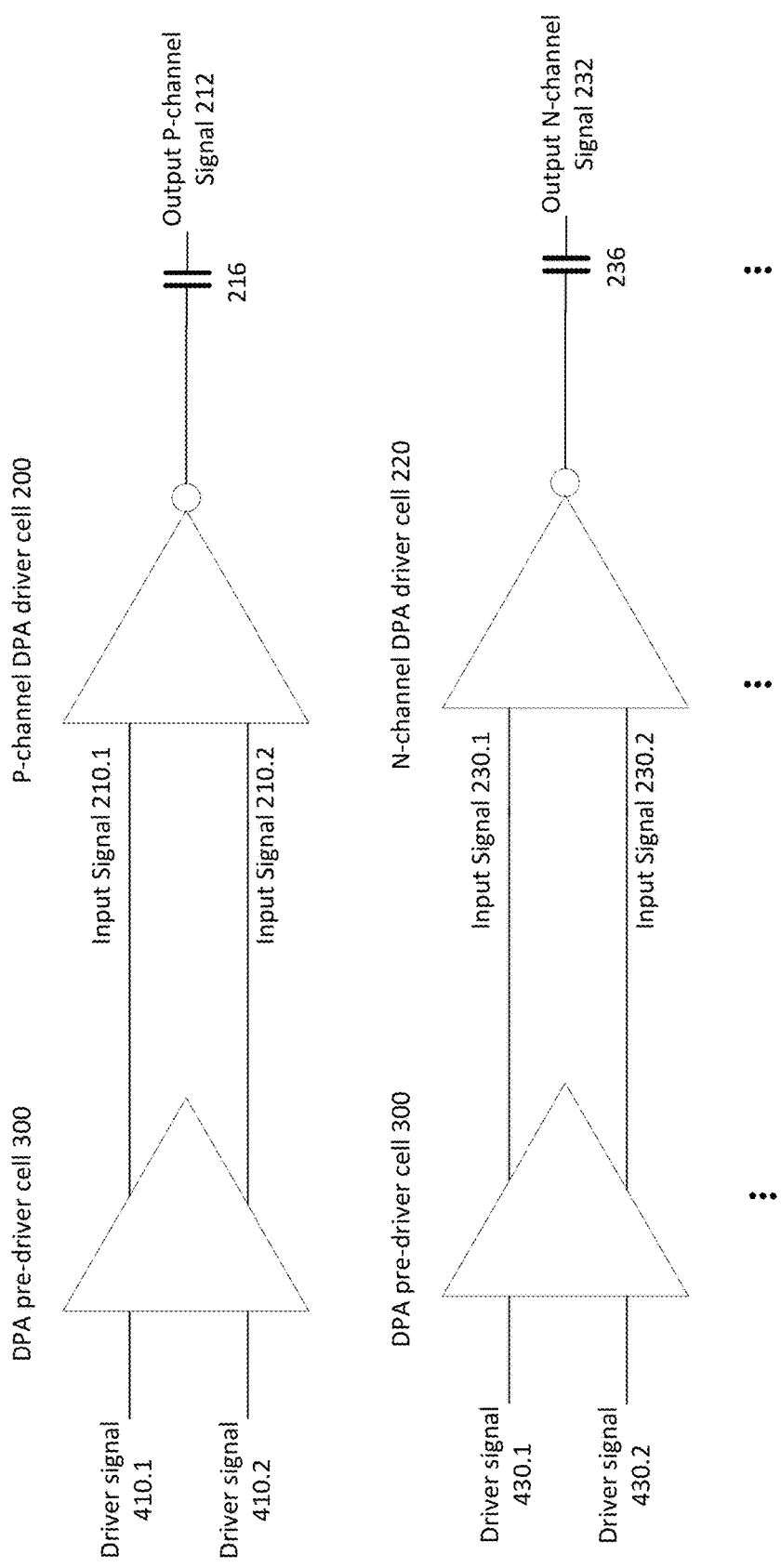
FIG. 5 illustrates a differential DPA driver cell architecture in accordance with the disclosure.

FIG. 5 illustrates a differential DPA driver cell, in accordance with the disclosure. The differential DPA driver cell 500 as shown in FIG. 5 illustrates an alternate view of the DPA driver cells 200, 220, each being driven by a respective DPA pre-driver cell 300 as shown in FIG. 3. The differential DPA driver cell 500 receives each of the driver signals 410.1, 410.2, 430.1, 430.2 as discussed herein with reference to the level shifting circuit 400 as shown in FIG. 4. Of course, the DPA pre-driver cell 300 is an optional component, and the driver signals 410.1, 410.2, 430.1, 430.2 may alternatively be coupled directly to each respective one the p-channel DPA driver cell 200 and n-channel DPA driver cell 220. In any event, each branch of the differential DPA driver cell 500 outputs a respective p-channel and n-channel output signal 212, 232, which are out of phase with one another by 180 degrees. The differential DPA driver cell 500 may be one such cell in an array of cells associated with a DTX architecture, such that the output signals 212, 232 are respectively combined from each DPA cell's output via the multiplicative capacitors 216, 236 in addition to appropriate analog-conversion circuitry such as an RF-DAC as noted above. That is, the output capacitors of each DPA driver cell in the array are all combined to a suitable output combiner that collect the energy delivered from each of the DPA driver cells. The combiner circuitry may be part of the RF-DAC or other suitable components and additional details are not shown for purposes of brevity.

DPA Driver Cell Simulations

Figure 6:
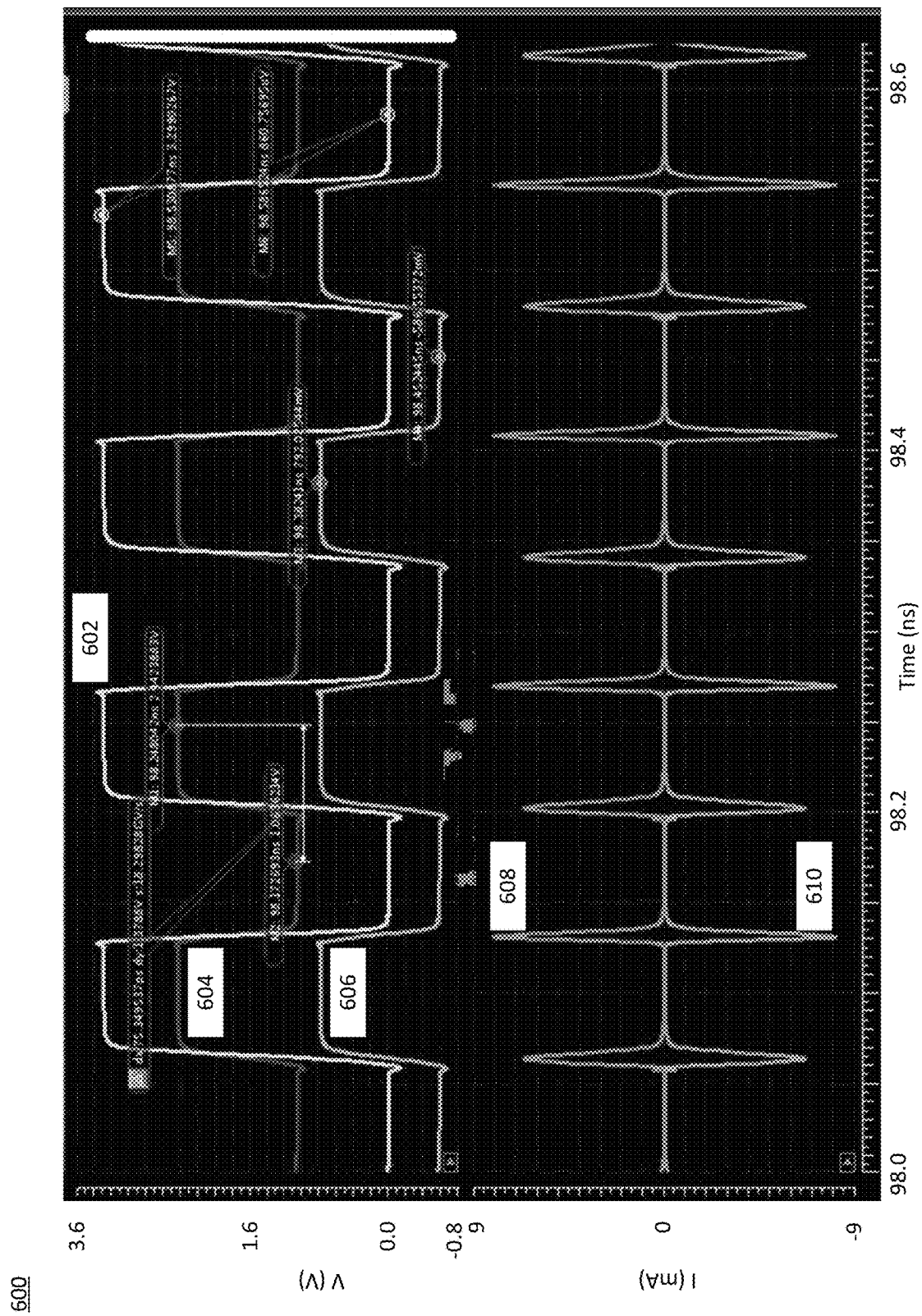
FIG. 6 illustrates a graph of a simulation depicting the voltage and current levels of transistors associated with the DPA driver cell as shown in FIG. 2A in accordance with the disclosure.

FIG. 6 illustrates a graph of a simulation depicting the voltage and current levels of transistors associated with the DPA driver cell as shown in FIG. 2A. As shown in FIG. 6, trace 602 represents the voltage of the output signal 212 at the output terminals of the transistors 202.3, 204.1. In other words, trace 602 represents variations in the voltage at the coupled terminals of the transistors 202.3, 204.1 and represent "pre-capacitor" voltages with respect to the capacitor 216. The trace 604 represents the voltage variations of the floating gate terminals of the transistors 202.3 204.1. The trace 606 represents differential voltage variations associated with the transistors 202.3 204.1, which demonstrates low stress due to the capacitive divider. The trace 608 represent variations in the supply current of the voltage source VDD, and the trace 610 represents variations in the supply current for the common voltage VSS, which is a ground current in this simulation.

Figure 7:
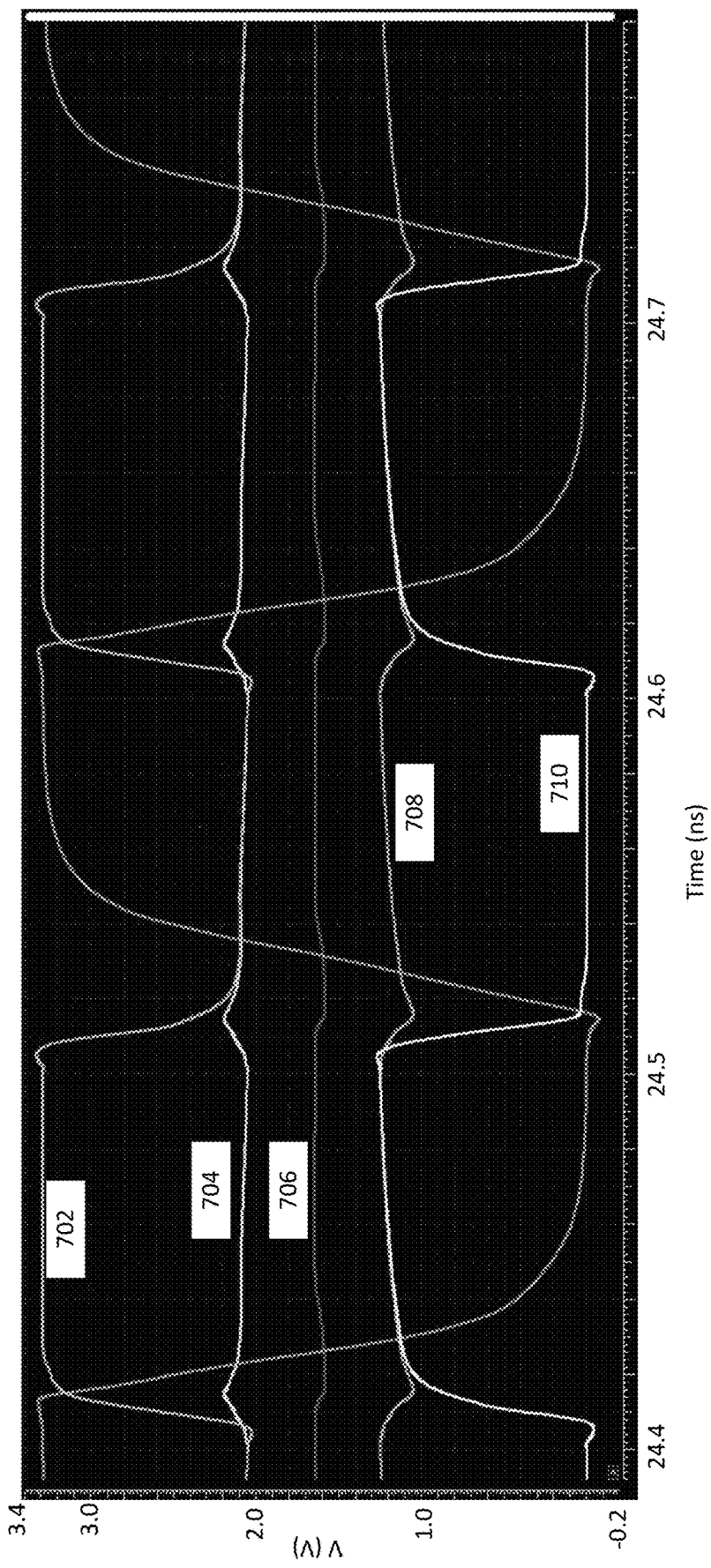
FIG. 7 illustrates a graph of a simulation depicting the voltage levels of transistors associated with the DPA pre-driver cell as shown in FIG. 3 in accordance with the disclosure.

FIG. 7 illustrates a graph of a simulation depicting the voltage levels of transistors associated with the DPA pre-driver cell as shown in FIG. 3. As shown in FIG. 7, the trace 702 represents voltage variations of the input signal 210.1, whereas the trace 710 represents voltage variations of the input signal 210.2. The traces 704, 706, and 708 represent voltage variations associated with the self-generated bias voltages 2×Vd,max, 1.5×Vd,max, and Vd,max, respectively, as shown in FIG. 2A.

Figure 8:
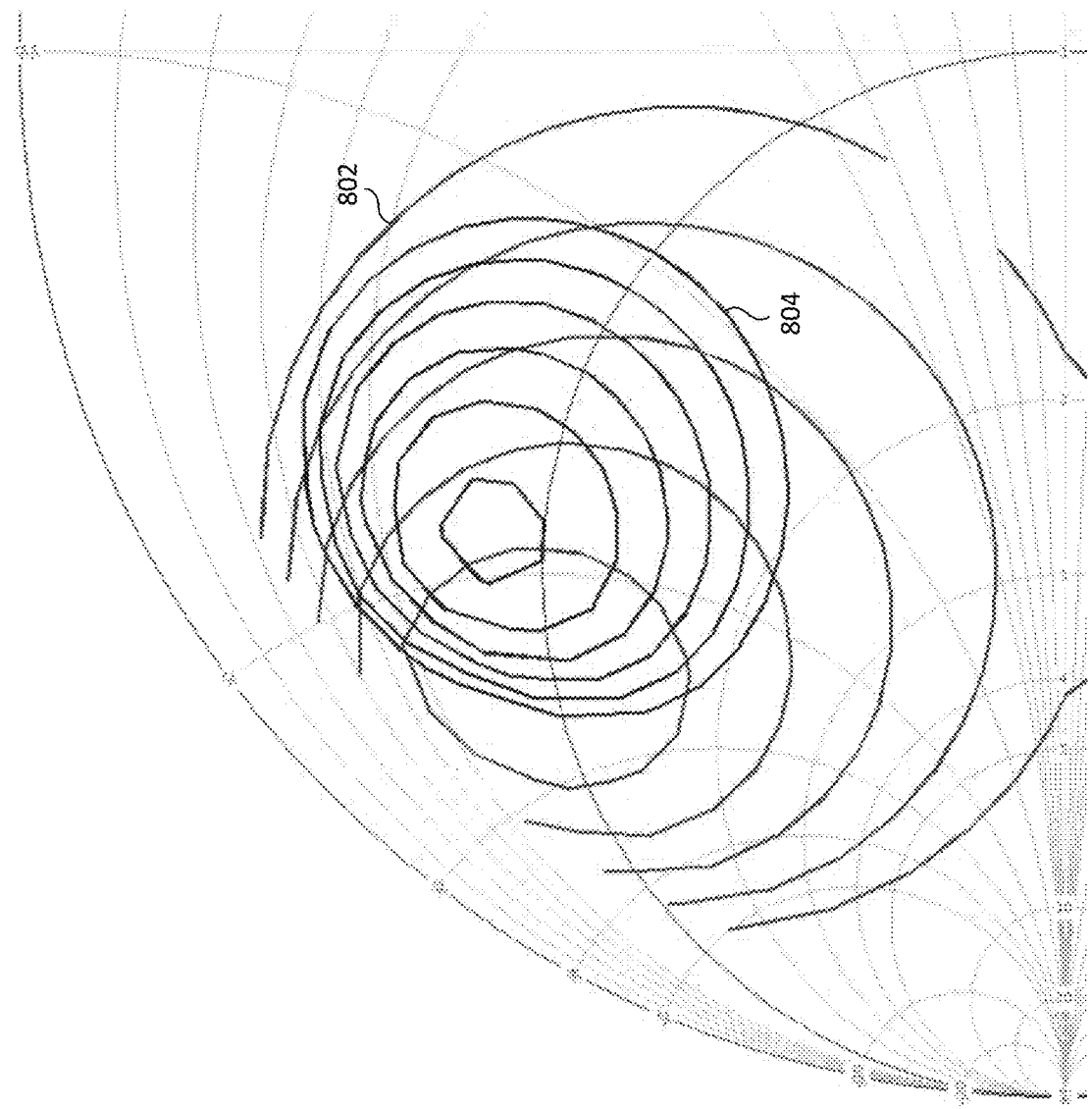
FIG. 8 illustrates a Smith chart depicting load pull simulations of a 128 cell array, in accordance with the disclosure.

FIG. 8 illustrates a Smith chart depicting load pull simulations of a 128 cell array, in accordance with the disclosure. The Smith chart shown in FIG. 8 represents the result of a load pull simulation at 7.2 GHz of a 128 cell array, with each cell comprising a DPA driver cell such as the differential DPA driver cell 500 as shown in FIG. 5. As shown in FIG. 8, the traces 802 correspond to the output power contours, whereas the traces 804 corresponds to the power added efficiency contours.

General Operation of the DPA Driver Cells 200, 220, DPA Pre-Driver Cell 300, and the DPA Level Shifting Circuit 400

A digital power amplifier circuit is provided. With reference to FIGS. 2A-2D, 3, and 4, the digital power amplifier circuit may include a plurality of p-type transistors, with a first one of the plurality of p-type transistors having a gate configured to be coupled to a first signal that varies between a first voltage range defined by a first upper voltage level and a first lower voltage level; a plurality of n-type transistors, with a first one of the plurality of n-type transistors having a gate configured to be coupled to a second signal that varies between a second voltage range defined by a second upper voltage level and a second lower voltage level; and a pair of transistors coupled to a gate of a second one of the plurality of p-type transistors and to a second one of the plurality of n-type transistors to form a capacitive divider between (i) the pair of transistors, and (ii) the second one of the plurality of p-type transistors and the second one of the plurality of n-type transistors thereby defining a feedback capacitive ratio, wherein the output of the digital power amplifier circuit is configured to generate an output signal in accordance with the feedback capacitive ratio such that the output signal varies between a third voltage range defined by the first upper voltage level of the first signal and the second lower voltage level of the second signal. Furthermore, the second one of the plurality of p-type transistors may have a floating gate that is coupled to a floating gate of the second one of the plurality of n-type transistors. In addition or in alternative to and in any combination with the optional features previously explained in this paragraph, a third one of the plurality of p-type transistors may have a floating gate configured to be coupled to a first direct current (DC) bias voltage, a third one of the plurality of n-type transistors may have a floating gate configured to be coupled to a second DC bias voltage, and the first bias voltage may be different than the second DC bias voltage. Moreover, and in addition or in alternative to and in any combination with the optional features previously explained in this paragraph, the first one of the plurality of p-type transistors may be configured to be coupled to a first voltage source that supplies a first supply voltage equal to the first upper voltage level of the first voltage range, and the first one of the plurality of n-type transistors may be configured to be coupled to a second voltage source that supplies a second supply voltage equal to the second lower voltage level of the second voltage range. Still further, and in addition or in alternative to and in any combination with the optional features previously explained in this paragraph, the first voltage source may be the only voltage source coupled to the plurality of p-type transistors, and the second voltage source may be the only voltage source coupled to the plurality of n-type transistors. Furthermore, and in addition or in alternative to and in any combination with the optional features previously explained in this paragraph, the first upper voltage level and the first lower voltage level may define a peak-to-peak amplitude of the first signal that is equal to a peak-to-peak amplitude of the second signal that is defined by the second upper voltage level and the second lower voltage level. In addition or in alternative to and in any combination with the optional features previously explained in this paragraph, the output signal may be generated without any one of the plurality of p-type transistors and the plurality of n-type transistors having a voltage across any two respective terminals that exceeds the peak-to-peak amplitude of the first and the second signal. Also, and in addition or in alternative to and in any combination with the optional features previously explained in this paragraph, the peak-to-peak amplitude of the first signal and the second signal may represent a maximum operating voltage associated with each one of the plurality of p-type transistors and the plurality of n-type transistors. Further, and in addition or in alternative to and in any combination with the optional features previously explained in this paragraph, the plurality of n-type transistors, the plurality of p-type transistors, and the pair of transistors may form part of a power amplifier driver cell from among an array of power amplifier driver cells associated with a radio frequency digital-to-analog converter (RF-DAC). Still further, and in addition or in alternative to and in any combination with the optional features previously explained in this paragraph, the digital power amplifier circuit may further include level shifting circuitry configured to generate the first signal and the second signal having the same peak-to-peak amplitude but being direct-current (DC) level-shifted with respect to one another. Moreover, and in addition or in alternative to and in any combination with the optional features previously explained in this paragraph, the level shifting circuitry may comprise a second plurality of p-type transistors, a second plurality of n-type transistors, and a second pair of transistors having the same configuration as the plurality of p-type transistors, the plurality of n-type transistors, and the pair of transistors, respectively. Further still, and in addition or in alternative to and in any combination with the optional features previously explained in this paragraph, the level shifting circuitry may be configured to generate a first DC bias voltage via one of the second plurality of p-type transistors, to generate a second DC bias voltage via one of the second plurality of n-type transistors, and to generate a third DC bias voltage via the second pair of transistors, and wherein the first, second, and third DC bias voltages are coupled to a respectively configured transistor from among the plurality of p-type transistors, the plurality of n-type transistors, and the pair of transistors.

A digital power amplifier driver cell is provided. The digital power amplifier driver cell may include a set of p-type transistors including a first p-type transistor having a gate configured to be coupled to a first time-varying digital signal that varies between a first logic high voltage level and a first logic low voltage level; a set of n-type transistors including a first n-type transistor having a gate configured to be coupled to a second time-varying digital signal that varies between a second logic high voltage level and a second logic low voltage level; and a pair of transistors coupled to a gate of a second one of the set of p-type transistors and to a second one of the set of n-type transistors to form a capacitive divider between (i) the pair of transistors, and (ii) the second one of the set of p-type transistors and the second one of the set of n-type transistors thereby defining a feedback capacitive ratio, wherein the power amplifier driver cell is configured to generate a time-varying digital output signal in accordance with the feedback capacitive ratio such that the time-varying digital output signal varies between the first logic high voltage level and the second logic low voltage level. In addition or in alternative to and in any combination with the optional features previously explained in this paragraph, the second one of the set of p-type transistors may have a floating gate that is coupled to a floating gate of the second one of the set of n-type transistors. Moreover, and in addition or in alternative to and in any combination with the optional features previously explained in this paragraph, a third one of the set of p-type transistors may have a floating gate configured to configured to be coupled to a first direct current (DC) bias voltage, a third one of the set of n-type transistors may have a floating gate configured to be coupled to a second DC bias voltage, and the first DC bias voltage may be different than the second DC bias voltage. Furthermore, and in addition or in alternative to and in any combination with the optional features previously explained in this paragraph, the first p-type transistor may be configured to be coupled to a first voltage source that supplies a first supply voltage equal to the first logic high voltage level, and the first n-type transistor may be configured to be coupled to a second voltage source that supplies a second supply voltage equal to the second logical low voltage level. Still further, and in addition or in alternative to and in any combination with the optional features previously explained in this paragraph, the first voltage source may be the only voltage source coupled to the set of p-type transistors, and wherein the second voltage source is the only voltage source coupled to the set of n-type transistors. In addition or in alternative to and in any combination with the optional features previously explained in this paragraph, the first logic high voltage level and the first logic low voltage level may define a peak-to-peak amplitude of the first time-varying digital signal and be equal to a peak-to-peak amplitude of the second time-varying digital signal that is defined by the second logic high voltage level and the second logic low voltage level. Also, and in addition or in alternative to and in any combination with the optional features previously explained in this paragraph, the time-varying digital output signal may be generated without any one of the set of n-type transistors and the set of p-type transistors having a voltage across any two respective terminals that exceeds the peak-to-peak amplitude of the first time-varying digital signal and the second time-varying digital signal. Moreover, and in addition or in alternative to and in any combination with the optional features previously explained in this paragraph, the peak-to-peak amplitude of the first time-varying digital signal and the second time-varying digital signal may represent a maximum operating voltage associated with each one of the set of p-type transistors and the set of n-type transistors. Further still, and in addition or in alternative to and in any combination with the optional features previously explained in this paragraph the power amplifier driver cell may be from among an array of power amplifier driver cells associated with a radio frequency digital-to-analog converter (RF-DAC). Also, and in addition or in alternative to and in any combination with the optional features previously explained in this paragraph, digital power amplifier driver cell may include level shifting circuitry configured to generate the first time-varying digital signal and the second time-varying digital signal having the same peak-to-peak amplitude but being direct-current (DC) level-shifted with respect to one another. Still further, and in addition or in alternative to and in any combination with the optional features previously explained in this paragraph, the level shifting circuitry may include a second set of p-type transistors, a second set of n-type transistors, and a second pair of transistors having the same configuration as the set of p-type transistors, the set of n-type transistors, and the pair of transistors, respectively. Furthermore, and in addition or in alternative to and in any combination with the optional features previously explained in this paragraph, the level shifting circuitry may be configured to generate a first DC bias voltage via one of the second set of p-type transistors, to generate a second DC bias voltage via one of the second set of n-type transistors, and to generate a third DC bias voltage via the second pair of transistors, and wherein the first, second, and third DC bias voltages are coupled to a respectively configured transistor from among the set of p-type transistors, the set of n-type transistors, and the pair of transistors.

EXAMPLES

The following examples pertain to various techniques of the present disclosure.

An example (e.g. example 1) relates to a digital power amplifier circuit. The digital power amplifier circuit comprises a plurality of p-type transistors, a first one of the plurality of p-type transistors having a gate configured to be coupled to a first signal that varies between a first voltage range defined by a first upper voltage level and a first lower voltage level; a plurality of n-type transistors, a first one of the plurality of n-type transistors having a gate configured to be coupled to a second signal that varies between a second voltage range defined by a second upper voltage level and a second lower voltage level; and a pair of transistors coupled to a gate of a second one of the plurality of p-type transistors and to a second one of the plurality of n-type transistors to form a capacitive divider between (i) the pair of transistors, and (ii) the second one of the plurality of p-type transistors and the second one of the plurality of n-type transistors thereby defining a feedback capacitive ratio, wherein the output of the digital power amplifier circuit is configured to generate an output signal in accordance with the feedback capacitive ratio such that the output signal varies between a third voltage range defined by the first upper voltage level of the first signal and the second lower voltage level of the second signal.

Another example (e.g. example 2) relates to a previously-described example (e.g. example 1) 1, wherein the second one of the plurality of p-type transistors has a floating gate that is coupled to a floating gate of the second one of the plurality of n-type transistors.

Another example (e.g. example 3) relates to a previously-described example (e.g. one or more of examples 1-2), wherein: a third one of the plurality of p-type transistors has a floating gate configured to be coupled to a first direct current (DC) bias voltage, a third one of the plurality of n-type transistors has a floating gate configured to be coupled to a second DC bias voltage, and the first bias voltage is different than the second DC bias voltage.

Another example (e.g. example 4) relates to a previously-described example (e.g. one or more of examples 1-3), wherein the first one of the plurality of p-type transistors is configured to be coupled to a first voltage source that supplies a first supply voltage equal to the first upper voltage level of the first voltage range, and wherein the first one of the plurality of n-type transistors is configured to be coupled to a second voltage source that supplies a second supply voltage equal to the second lower voltage level of the second voltage range.

Another example (e.g. example 5) relates to a previously-described example (e.g. one or more of examples 1-4), wherein the first voltage source is the only voltage source coupled to the plurality of p-type transistors, and wherein the second voltage source is the only voltage source coupled to the plurality of n-type transistors.

Another example (e.g. example 6) relates to a previously-described example (e.g. one or more of examples 1-5), wherein the first upper voltage level and the first lower voltage level define a peak-to-peak amplitude of the first signal that is equal to a peak-to-peak amplitude of the second signal that is defined by the second upper voltage level and the second lower voltage level.

Another example (e.g. example 7) relates to a previously-described example (e.g. one or more of examples 1-6), wherein the output signal is generated without any one of the plurality of p-type transistors and the plurality of n-type transistors having a voltage across any two respective terminals that exceeds the peak-to-peak amplitude of the first and the second signal.

Another example (e.g. example 8) relates to a previously-described example (e.g. one or more of examples 1-7), wherein the peak-to-peak amplitude of the first signal and the second signal represents a maximum operating voltage associated with each one of the plurality of p-type transistors and the plurality of n-type transistors.

Another example (e.g. example 9) relates to a previously-described example (e.g. one or more of examples 1-8), wherein the plurality of n-type transistors, the plurality of p-type transistors, and the pair of transistors form part of a power amplifier driver cell from among an array of power amplifier driver cells associated with a radio frequency digital-to-analog converter (RF-DAC).

Another example (e.g. example 10) relates to a previously-described example (e.g. one or more of examples 1-9), further comprising: level shifting circuitry configured to generate the first signal and the second signal having the same peak-to-peak amplitude but being direct-current (DC) level-shifted with respect to one another.

Another example (e.g. example 11) relates to a previously-described example (e.g. one or more of examples 1-10), wherein the level shifting circuitry comprises a second plurality of p-type transistors, a second plurality of n-type transistors, and a second pair of transistors having the same configuration as the plurality of p-type transistors, the plurality of n-type transistors, and the pair of transistors, respectively.

Another example (e.g. example 12) relates to a previously-described example (e.g. one or more of examples 1-11), wherein the level shifting circuitry is configured to generate a first DC bias voltage via one of the second plurality of p-type transistors, to generate a second DC bias voltage via one of the second plurality of n-type transistors, and to generate a third DC bias voltage via the second pair of transistors, and wherein the first, second, and third DC bias voltages are coupled to a respectively configured transistor from among the plurality of p-type transistors, the plurality of n-type transistors, and the pair of transistors.

An example (e.g. example 13) relates to a digital power amplifier driver cell. The digital power amplifier driver cell comprises a set of p-type transistors including a first p-type transistor having a gate configured to be coupled to a first time-varying digital signal that varies between a first logic high voltage level and a first logic low voltage level; a set of n-type transistors including a first n-type transistor having a gate configured to be coupled to a second time-varying digital signal that varies between a second logic high voltage level and a second logic low voltage level; and a pair of transistors coupled to a gate of a second one of the set of p-type transistors and to a second one of the set of n-type transistors to form a capacitive divider between (i) the pair of transistors, and (ii) the second one of the set of p-type transistors and the second one of the set of n-type transistors thereby defining a feedback capacitive ratio, wherein the power amplifier driver cell is configured to generate a time-varying digital output signal in accordance with the feedback capacitive ratio such that the time-varying digital output signal varies between the first logic high voltage level and the second logic low voltage level.

Another example (e.g. example 14) relates to a previously-described example (e.g. example 13), wherein the second one of the set of p-type transistors has a floating gate that is coupled to a floating gate of the second one of the set of n-type transistors.

Another example (e.g. example 15) relates to a previously-described example (e.g. one or more of examples 13-14), wherein: a third one of the set of p-type transistors has a floating gate configured to configured to be coupled to a first direct current (DC) bias voltage, a third one of the set of n-type transistors has a floating gate configured to be coupled to a second DC bias voltage, and the first DC bias voltage is different than the second DC bias voltage.

Another example (e.g. example 16) relates to a previously-described example (e.g. one or more of examples 13-15), wherein the first p-type transistor is configured to be coupled to a first voltage source that supplies a first supply voltage equal to the first logic high voltage level, and wherein first n-type transistor is configured to be coupled to a second voltage source that supplies a second supply voltage equal to the second logical low voltage level.

Another example (e.g. example 17) relates to a previously-described example (e.g. one or more of examples 13-16), wherein the first voltage source is the only voltage source coupled to the set of p-type transistors, and wherein the second voltage source is the only voltage source coupled to the set of n-type transistors.

Another example (e.g. example 18) relates to a previously-described example (e.g. one or more of examples 13-17), wherein the first logic high voltage level and the first logic low voltage level define a peak-to-peak amplitude of the first time-varying digital signal and is equal to a peakto-peak amplitude of the second time-varying digital signal that is defined by the second logic high voltage level and the second logic low voltage level.

Another example (e.g. example 19) relates to a previously-described example (e.g. one or more of examples 13-18), wherein the time-varying digital output signal is generated without any one of the set of n-type transistors and the set of p-type transistors having a voltage across any two respective terminals that exceeds the peak-to-peak amplitude of the first time-varying digital signal and the second time-varying digital signal.

Another example (e.g. example 20) relates to a previously-described example (e.g. one or more of examples 13-19), wherein the peak-to-peak amplitude of the first time-varying digital signal and the second time-varying digital signal represents a maximum operating voltage associated with each one of the set of p-type transistors and the set of n-type transistors.

Another example (e.g. example 21) relates to a previously-described example (e.g. one or more of examples 13-20), wherein power amplifier driver cell is from among an array of power amplifier driver cells associated with a radio frequency digital-to-analog converter (RF-DAC).

Another example (e.g. example 22) relates to a previously-described example (e.g. one or more of examples 13-21), further comprising: level shifting circuitry configured to generate the first time-varying digital signal and the second time-varying digital signal having the same peak-to-peak amplitude but being direct-current (DC) level-shifted with respect to one another.

Another example (e.g. example 23) relates to a previously-described example (e.g. one or more of examples 13-22), wherein the level shifting circuitry comprises a second set of p-type transistors, a second set of n-type transistors, and a second pair of transistors having the same configuration as the set of p-type transistors, the set of n-type transistors, and the pair of transistors, respectively.

Another example (e.g. example 24) relates to a previously-described example (e.g. one or more of examples 13-23), wherein the level shifting circuitry is configured to generate a first DC bias voltage via one of the second set of p-type transistors, to generate a second DC bias voltage via one of the second set of n-type transistors, and to generate a third DC bias voltage via the second pair of transistors, and wherein the first, second, and third DC bias voltages are coupled to a respectively configured transistor from among the set of p-type transistors, the set of n-type transistors, and the pair of transistors.

An example (e.g. example 25) relates to a digital power amplifier means. The digital power amplifier means comprises a plurality of p-type transistors, a first one of the plurality of p-type transistors having a gate configured to be coupled to a first signal that varies between a first voltage range defined by a first upper voltage level and a first lower voltage level; a plurality of n-type transistors, a first one of the plurality of n-type transistors having a gate configured to be coupled to a second signal that varies between a second voltage range defined by a second upper voltage level and a second lower voltage level; and a pair of transistors coupled to a gate of a second one of the plurality of p-type transistors and to a second one of the plurality of n-type transistors to form a capacitive divider between (i) the pair of transistors, and (ii) the second one of the plurality of p-type transistors and the second one of the plurality of n-type transistors thereby defining a feedback capacitive ratio, wherein the output of the digital power amplifier means is configured to generate an output signal in accordance with the feedback capacitive ratio such that the output signal varies between a third voltage range defined by the first upper voltage level of the first signal and the second lower voltage level of the second signal.

Another example (e.g. example 26) relates to a previously-described example (e.g. example 25) 1, wherein the second one of the plurality of p-type transistors has a floating gate that is coupled to a floating gate of the second one of the plurality of n-type transistors.

Another example (e.g. example 27) relates to a previously-described example (e.g. one or more of examples 25-26), wherein: a third one of the plurality of p-type transistors has a floating gate configured to be coupled to a first direct current (DC) bias voltage, a third one of the plurality of n-type transistors has a floating gate configured to be coupled to a second DC bias voltage, and the first bias voltage is different than the second DC bias voltage.

Another example (e.g. example 28) relates to a previously-described example (e.g. one or more of examples 25-27), wherein the first one of the plurality of p-type transistors is configured to be coupled to a first voltage source that supplies a first supply voltage equal to the first upper voltage level of the first voltage range, and wherein the first one of the plurality of n-type transistors is configured to be coupled to a second voltage source that supplies a second supply voltage equal to the second lower voltage level of the second voltage range.

Another example (e.g. example 29) relates to a previously-described example (e.g. one or more of examples 25-28), wherein the first voltage source is the only voltage source coupled to the plurality of p-type transistors, and wherein the second voltage source is the only voltage source coupled to the plurality of n-type transistors.

Another example (e.g. example 30) relates to a previously-described example (e.g. one or more of examples 25-29), wherein the first upper voltage level and the first lower voltage level define a peak-to-peak amplitude of the first signal that is equal to a peak-to-peak amplitude of the second signal that is defined by the second upper voltage level and the second lower voltage level.

Another example (e.g. example 31) relates to a previously-described example (e.g. one or more of examples 25-30), wherein the output signal is generated without any one of the plurality of p-type transistors and the plurality of n-type transistors having a voltage across any two respective terminals that exceeds the peak-to-peak amplitude of the first and the second signal.

Another example (e.g. example 32) relates to a previously-described example (e.g. one or more of examples 25-31), wherein the peak-to-peak amplitude of the first signal and the second signal represents a maximum operating voltage associated with each one of the plurality of p-type transistors and the plurality of n-type transistors.

Another example (e.g. example 33) relates to a previously-described example (e.g. one or more of examples 25-32), wherein the plurality of n-type transistors, the plurality of p-type transistors, and the pair of transistors form part of a power amplifier driver means from among an array of power amplifier driver means associated with a radio frequency digital-to-analog converter (RF-DAC) means.

Another example (e.g. example 34) relates to a previously-described example (e.g. one or more of examples 25-33), further comprising: level shifting means for generating the first signal and the second signal having the same peak-to-peak amplitude but being direct-current (DC) level-shifted with respect to one another.

Another example (e.g. example 35) relates to a previously-described example (e.g. one or more of examples 25-34), wherein the level shifting means comprises a second plurality of p-type transistors, a second plurality of n-type transistors, and a second pair of transistors having the same configuration as the plurality of p-type transistors, the plurality of n-type transistors, and the pair of transistors, respectively.

Another example (e.g. example 36) relates to a previously-described example (e.g. one or more of examples 25-35), wherein the level shifting means generates a first DC bias voltage via one of the second plurality of p-type transistors, generates a second DC bias voltage via one of the second plurality of n-type transistors, and generates a third DC bias voltage via the second pair of transistors, and wherein the first, second, and third DC bias voltages are coupled to a respectively configured transistor from among the plurality of p-type transistors, the plurality of n-type transistors, and the pair of transistors.

An example (e.g. example 37) relates to a digital power amplifier driver means. The digital power amplifier driver means comprises a set of p-type transistors including a first p-type transistor having a gate configured to be coupled to a first time-varying digital signal that varies between a first logic high voltage level and a first logic low voltage level; a set of n-type transistors including a first n-type transistor having a gate configured to be coupled to a second time-varying digital signal that varies between a second logic high voltage level and a second logic low voltage level; and a pair of transistors coupled to a gate of a second one of the set of p-type transistors and to a second one of the set of n-type transistors to form a capacitive divider between (i) the pair of transistors, and (ii) the second one of the set of p-type transistors and the second one of the set of n-type transistors thereby defining a feedback capacitive ratio, wherein the power amplifier driver cell is configured to generate a time-varying digital output signal in accordance with the feedback capacitive ratio such that the time-varying digital output signal varies between the first logic high voltage level and the second logic low voltage level.

Another example (e.g. example 38) relates to a previously-described example (e.g. example 37), wherein the second one of the set of p-type transistors has a floating gate that is coupled to a floating gate of the second one of the set of n-type transistors.

Another example (e.g. example 39) relates to a previously-described example (e.g. one or more of examples 37-38), wherein: a third one of the set of p-type transistors has a floating gate configured to configured to be coupled to a first direct current (DC) bias voltage, a third one of the set of n-type transistors has a floating gate configured to be coupled to a second DC bias voltage, and the first DC bias voltage is different than the second DC bias voltage.

Another example (e.g. example 40) relates to a previously-described example (e.g. one or more of examples 37-39), wherein the first p-type transistor is configured to be coupled to a first voltage source that supplies a first supply voltage equal to the first logic high voltage level, and wherein first n-type transistor is configured to be coupled to a second voltage source that supplies a second supply voltage equal to the second logical low voltage level.

Another example (e.g. example 41) relates to a previously-described example (e.g. one or more of examples 37-40), wherein the first voltage source is the only voltage source coupled to the set of p-type transistors, and wherein the second voltage source is the only voltage source coupled to the set of n-type transistors.

Another example (e.g. example 42) relates to a previously-described example (e.g. one or more of examples 37-41), wherein the first logic high voltage level and the first logic low voltage level define a peak-to-peak amplitude of the first time-varying digital signal and is equal to a peak-to-peak amplitude of the second time-varying digital signal that is defined by the second logic high voltage level and the second logic low voltage level.

Another example (e.g. example 43) relates to a previously-described example (e.g. one or more of examples 37-42), wherein the time-varying digital output signal is generated without any one of the set of n-type transistors and the set of p-type transistors having a voltage across any two respective terminals that exceeds the peak-to-peak amplitude of the first time-varying digital signal and the second time-varying digital signal.

Another example (e.g. example 44) relates to a previously-described example (e.g. one or more of examples 37-43), wherein the peak-to-peak amplitude of the first time-varying digital signal and the second time-varying digital signal represents a maximum operating voltage associated with each one of the set of p-type transistors and the set of n-type transistors.

Another example (e.g. example 45) relates to a previously-described example (e.g. one or more of examples 37-44), wherein power amplifier driver means is from among an array of power amplifier driver means associated with a radio frequency digital-to-analog converter (RF-DAC) means.

Another example (e.g. example 46) relates to a previously-described example (e.g. one or more of examples 37-45), further comprising: level shifting means for generating the first time-varying digital signal and the second time-varying digital signal having the same peak-to-peak amplitude but being direct-current (DC) level-shifted with respect to one another.

Another example (e.g. example 47) relates to a previously-described example (e.g. one or more of examples 37-46), wherein the level shifting means comprises a second set of p-type transistors, a second set of n-type transistors, and a second pair of transistors having the same configuration as the set of p-type transistors, the set of n-type transistors, and the pair of transistors, respectively.

Another example (e.g. example 48) relates to a previously-described example (e.g. one or more of examples 37-47), wherein the level shifting means generates a first DC bias voltage via one of the second set of p-type transistors, generates a second DC bias voltage via one of the second set of n-type transistors, and generates a third DC bias voltage via the second pair of transistors, and wherein the first, second, and third DC bias voltages are coupled to a respectively configured transistor from among the set of p-type transistors, the set of n-type transistors, and the pair of transistors.

An apparatus as shown and described.

A method as shown and described.

CONCLUSION

The aforementioned description of the specific aspects will so fully reveal the general nature of the disclosure that others can, by applying knowledge within the skill of the art, readily modify and/or adapt for various applications such specific aspects, without undue experimentation, and without departing from the general concept of the present disclosure. Therefore, such adaptations and modifications are intended to be within the meaning and range of equivalents of the disclosed aspects, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

References in the specification to "one aspect," "an aspect," "an exemplary aspect," etc., indicate that the aspect described may include a particular feature, structure, or characteristic, but every aspect may not necessarily include the particular feature, structure, or characteristic. Moreover, such phrases are not necessarily referring to the same aspect. Further, when a particular feature, structure, or characteristic is described in connection with an aspect, it is submitted that it is within the knowledge of one skilled in the art to affect such feature, structure, or characteristic in connection with other aspects whether or not explicitly described.

The exemplary aspects described herein are provided for illustrative purposes, and are not limiting. Other exemplary aspects are possible, and modifications may be made to the exemplary aspects. Therefore, the specification is not meant to limit the disclosure. Rather, the scope of the disclosure is defined only in accordance with the following claims and their equivalents.

Aspects may be implemented in hardware (e.g., circuits), firmware, software, or any combination thereof. Aspects may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact results from computing devices, processors, controllers, or other devices executing the firmware, software, routines, instructions, etc. Further, any of the implementation variations may be carried out by a general purpose computer.

For the purposes of this discussion, the term "processing circuitry" or "processor circuitry" shall be understood to be circuit(s), processor(s), logic, or a combination thereof. For example, a circuit can include an analog circuit, a digital circuit, state machine logic, other structural electronic hardware, or a combination thereof. A processor can include a microprocessor, a digital signal processor (DSP), or other hardware processor. The processor can be "hard-coded" with instructions to perform corresponding function(s) according to aspects described herein. Alternatively, the processor can access an internal and/or external memory to retrieve instructions stored in the memory, which when executed by the processor, perform the corresponding function(s) associated with the processor, and/or one or more functions and/or operations related to the operation of a component having the processor included therein.

In one or more of the exemplary aspects described herein, processing circuitry can include memory that stores data and/or instructions. The memory can be any well-known volatile and/or non-volatile memory, including, for example, read-only memory (ROM), random access memory (RAM), flash memory, a magnetic storage media, an optical disc, erasable programmable read only memory (EPROM), and programmable read only memory (PROM). The memory can be non-removable, removable, or a combination of both.

What is claimed is:

1. A digital power amplifier circuit, comprising:
   a plurality of p-type transistors, a first one of the plurality of p-type transistors having a gate configured to be coupled to a first signal that varies between a first voltage range defined by a first upper voltage level and a first lower voltage level;
   a plurality of n-type transistors, a first one of the plurality of n-type transistors having a gate configured to be coupled to a second signal that varies between a second voltage range defined by a second upper voltage level and a second lower voltage level; and
   a pair of transistors coupled to a gate of a second one of the plurality of p-type transistors and to a second one of the plurality of n-type transistors to form a capacitive divider between (i) the pair of transistors, and (ii) the second one of the plurality of p-type transistors and the second one of the plurality of n-type transistors thereby defining a feedback capacitive ratio,
   wherein an output of the digital power amplifier circuit is configured to generate an output signal in accordance with the feedback capacitive ratio such that the output signal varies between a third voltage range defined by the first upper voltage level of the first signal and the second lower voltage level of the second signal.

2. The digital power amplifier circuit of claim 1, wherein the second one of the plurality of p-type transistors has a floating gate that is coupled to a floating gate of the second one of the plurality of n-type transistors.

3. The digital power amplifier circuit of claim 2, wherein:
   a third one of the plurality of p-type transistors has a floating gate configured to be coupled to a first direct current (DC) bias voltage,
   a third one of the plurality of n-type transistors has a floating gate configured to be coupled to a second DC bias voltage, and
   the first bias voltage is different than the second DC bias voltage.

4. The digital power amplifier of claim 1, wherein the first one of the plurality of p-type transistors is configured to be coupled to a first voltage source that supplies a first supply voltage equal to the first upper voltage level of the first voltage range, and
   wherein the first one of the plurality of n-type transistors is configured to be coupled to a second voltage source that supplies a second supply voltage equal to the second lower voltage level of the second voltage range.

5. The digital power amplifier of claim 4, wherein the first voltage source is the only voltage source coupled to the plurality of p-type transistors, and
   wherein the second voltage source is the only voltage source coupled to the plurality of n-type transistors.

6. The digital power amplifier circuit of claim 1, wherein the first upper voltage level and the first lower voltage level define a peak-to-peak amplitude of the first signal that is equal to a peak-to-peak amplitude of the second signal that is defined by the second upper voltage level and the second lower voltage level.

7. The digital power amplifier circuit of claim 6, wherein the output signal is generated without any one of the plurality of p-type transistors and the plurality of n-type transistors having a voltage across any two respective terminals that exceeds the peak-to-peak amplitude of the first and the second signal.

8. The digital power amplifier circuit of claim 6, wherein the peak-to-peak amplitude of the first signal and the second signal represents a maximum operating voltage associated with each one of the plurality of p-type transistors and the plurality of n-type transistors.

9. The digital power amplifier circuit of claim 1, wherein the plurality of n-type transistors, the plurality of p-type transistors, and the pair of transistors form part of a power amplifier driver cell from among an array of power amplifier driver cells associated with a radio frequency digital-to-analog converter (RF-DAC).

10. The digital power amplifier of claim 1, further comprising:
  level shifting circuitry configured to generate the first signal and the second signal having the same peak-to-peak amplitude but being direct-current (DC) level-shifted with respect to one another.

11. The digital power amplifier of claim 10, wherein the level shifting circuitry comprises a second plurality of p-type transistors, a second plurality of n-type transistors, and a second pair of transistors having the same configuration as the plurality of p-type transistors, the plurality of n-type transistors, and the pair of transistors, respectively.

12. The digital power amplifier of claim 11, wherein the level shifting circuitry is configured to generate a first DC bias voltage via one of the second plurality of p-type transistors, to generate a second DC bias voltage via one of the second plurality of n-type transistors, and to generate a third DC bias voltage via the second pair of transistors, and
  wherein the first, second, and third DC bias voltages are coupled to a respectively configured transistor from among the plurality of p-type transistors, the plurality of n-type transistors, and the pair of transistors.

13. A digital power amplifier driver cell, comprising:
  a set of p-type transistors including a first p-type transistor having a gate configured to be coupled to a first time-varying digital signal that varies between a first logic high voltage level and a first logic low voltage level;
  a set of n-type transistors including a first n-type transistor having a gate configured to be coupled to a second time-varying digital signal that varies between a second logic high voltage level and a second logic low voltage level; and
  a pair of transistors coupled to a gate of a second one of the set of p-type transistors and to a second one of the set of n-type transistors to form a capacitive divider between (i) the pair of transistors, and (ii) the second one of the set of p-type transistors and the second one of the set of n-type transistors thereby defining a feedback capacitive ratio,
  wherein an output of the digital power amplifier driver cell is configured to generate a time-varying digital output signal in accordance with the feedback capacitive ratio such that the time-varying digital output signal varies between the first logic high voltage level and the second logic low voltage level.

14. The digital power amplifier driver cell of claim 13, wherein the second one of the set of p-type transistors has a floating gate that is coupled to a floating gate of the second one of the set of n-type transistors.

15. The digital power amplifier driver cell of claim 14, wherein:

a third one of the set of p-type transistors has a floating gate configured to configured to be coupled to a first direct current (DC) bias voltage,
a third one of the set of n-type transistors has a floating gate configured to be coupled to a second DC bias voltage, and
the first DC bias voltage is different than the second DC bias voltage.

16. The digital power amplifier driver cell of claim 13, wherein the first p-type transistor is configured to be coupled to a first voltage source that supplies a first supply voltage equal to the first logic high voltage level, and
  wherein first n-type transistor is configured to be coupled to a second voltage source that supplies a second supply voltage equal to the second logical low voltage level.

17. The digital power amplifier driver cell of claim 16, wherein the first voltage source is the only voltage source coupled to the set of p-type transistors, and
  wherein the second voltage source is the only voltage source coupled to the set of n-type transistors.

18. The digital power amplifier driver cell of claim 13, wherein the first logic high voltage level and the first logic low voltage level define a peak-to-peak amplitude of the first time-varying digital signal and is equal to a peak-to-peak amplitude of the second time-varying digital signal that is defined by the second logic high voltage level and the second logic low voltage level.

19. The digital power amplifier driver cell of claim 18, wherein the time-varying digital output signal is generated without any one of the set of n-type transistors and the set of p-type transistors having a voltage across any two respective terminals that exceeds the peak-to-peak amplitude of the first time-varying digital signal and the second time-varying digital signal.

20. The digital power amplifier driver cell of claim 18, wherein the peak-to-peak amplitude of the first time-varying digital signal and the second time-varying digital signal represents a maximum operating voltage associated with each one of the set of p-type transistors and the set of n-type transistors.

21. The digital power amplifier driver cell of claim 13, wherein power amplifier driver cell is from among an array of power amplifier driver cells associated with a radio frequency digital-to-analog converter (RF-DAC).

22. The digital power amplifier driver cell of claim 13, further comprising:
  level shifting circuitry configured to generate the first time-varying digital signal and the second time-varying digital signal having the same peak-to-peak amplitude but being direct-current (DC) level-shifted with respect to one another.

23. The digital power amplifier driver cell of claim 22, wherein the level shifting circuitry comprises a second set of p-type transistors, a second set of n-type transistors, and a second pair of transistors having the same configuration as the set of p-type transistors, the set of n-type transistors, and the pair of transistors, respectively.

24. The digital power amplifier driver cell of claim 23, wherein the level shifting circuitry is configured to generate a first DC bias voltage via one of the second set of p-type transistors, to generate a second DC bias voltage via one of the second set of n-type transistors, and to generate a third DC bias voltage via the second pair of transistors, and
  wherein the first, second, and third DC bias voltages are coupled to a respectively configured transistor from among the set of p-type transistors, the set of n-type transistors, and the pair of transistors.

* * * * *